US006480129B1

(12) United States Patent
Melanson

(10) Patent No.: US 6,480,129 B1
(45) Date of Patent: Nov. 12, 2002

(54) METHODS AND APPARATUS FOR CORRECTION OF HIGHER ORDER DELTA SIGMA CONVERTERS

(75) Inventor: John Laurence Melanson, Boulder, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/510,034

(22) Filed: Feb. 22, 2000

Related U.S. Application Data

(60) Provisional application No. 60/121,269, filed on Feb. 23, 1999, and provisional application No. 60/124,631, filed on Mar. 16, 1999.

(51) Int. Cl.[7] ................................................ H03M 3/00

(52) U.S. Cl. ......................... 341/143; 341/77; 341/138; 341/200

(58) Field of Search ................................ 341/143, 124, 341/125, 126, 200, 131, 77, 138, 140

(56) References Cited

U.S. PATENT DOCUMENTS

| | | | | |
|---|---|---|---|---|
| 5,103,229 A | * | 4/1992 | Ribner | 341/143 |
| 5,784,017 A | | 7/1998 | Craven | |
| 5,815,102 A | * | 9/1998 | Melanson | 341/143 |
| 5,982,317 A | * | 11/1999 | Steensgaard-Madsen | 341/143 |
| 6,150,969 A | * | 11/2000 | Melanson | 341/143 |

OTHER PUBLICATIONS

Risbo, Lars, and Hans Anderson, "Conversion of a PCM Signal into a UPWM Signal," International Application No. PCT/DK97/00133 filed Mar. 26, 1997, International Publication No. WO 97/37433 published Oct. 9, 1997.

Goldberg, J.M., and M.B. Sandler. "Pseudo–Natural Pulse Width Modulation for High Accuracy Digital–to–Analogue Conversion," *Electronics Letters*, vol. 27, No. 16, Aug. 1991, pp. 1491–1492.

Hawksford, M.O.J. "Dynamic Model–Based Linearization of Quantized Pulse–Width Modulation for Applications in Digital–to–Analog Conversion and Digital Power Amplifier Systems," *J. Audio Eng. Soc.*, vol. 40, No. 4, Apr. 1992, pp. 235–252.

Craven, Peter. "Toward the 24–bit DAC: Novel NoiseShaping Topologies Incorporating Correction for the Nonlinearity in a PWM Output Stage," *J. Audio Eng. Soc.*, vol. 41, No. 5, May 1993, pp. 291–313.

Matsuya, Yasuyuki, Kuniharu Uchimura, Atsushi Iwata, and Takao Kaneko. "A 17–bit Oversampling D–to–A Conversion Technology Using Multistage Noise Shaping," *IEEE Journal of Solid–State Circuits*, vol. 24, No. 4, Aug. 1989, pp. 969–975.

Matsuya, Yasuyuki, Kuniharu Uchimura, Atsushi Iwata, Tsutomu Kobayashi, Masayuki Ishikawa and Takeshi Yoshitome. "A 16–bit Oversampling A–to–D Conversion Technology Using Triple–Integration Noise Shaping," *IEEE Journal of Solid–State Circuits*, vol. SC–22, No. 6, Dec. 1987, pp. 921–929.

Candy, James C., and An–ni Huynh. "Double Interpolation for Digital–to–Analog Conversion," *IEEE Transactions on Communications*, vol. COM–34, No. 1, Jan. 1986, pp. 77–81.

* cited by examiner

*Primary Examiner*—Brian Young
*Assistant Examiner*—John B Nguyen
(74) *Attorney, Agent, or Firm*—Jennifer L. Bales Esq.; Dan A. Shifrin Esq.

(57) ABSTRACT

A technique for correcting higher order delta sigma modulators in audio components, which use mutually nonlinear feedback and feed forward functions. Methods and apparatus are provided to correct jitter and spread in the delta sigma converter due to quantization error, to permit the processing of data streams entering the converter at a different clock rate from that of the modulator, and to permit step up ratios to be changed on the fly in order to reduce radio frequency interference from the output signal.

8 Claims, 56 Drawing Sheets

Figure 3: Prior Art

```
makedsfb[fs_, fc_, n_, zeros_, nz_] :=
 Module[{res, ww, pp, d1, d1nr,
   d1nd, d1ndc, bnc, lp, zrs, sig, d1sr},

(* make a feedback type of ds modulator
       fs = modulator sample frequency
       fc = corner frequency
       n = order (number of integrators,
         all delay free)
       zeros = the complex resonator coef.
       nz = number of complex resonators
*)
  lp[fs1_, fc1_, n1_] :=
   Module[{cp, cp1, pz, r, a1, r1},
   cp1 = Together[(1 - zm * (1 + s1) / (1 - s1)) *
        (1 - zm * (1 + s2) / (1 - s2)) /.
      {s1 -> r1 * Cos[x] + I * r1 * Sin[x],
        s2 -> r1 * Cos[x] - I * r1 * Sin[x]}];
   cp = Expand[Numerator[cp1]] /
      Expand[Denominator[cp1]];
   rp = 1 - zm * (1 + s1) / (1 - s1) /. s1 -> -r1;
   r := N[Tan[fc1 / fs1 * 2 * π / 2]];
   pz := Product[cp /. x -> i π / (2 n1),
       {i, n1 + 1, 2 n1 - 1, 2}] /; EvenQ[n1];
   pz := Product[cp /. x -> i π / n1,
        {i, (n1 + 1) / 2, n1 - 1}] * rp /;
      OddQ[n1];
   N[Collect[pz /. {r1 -> r}, zm]]
  ];

  zrs[g1_, n1_] := Product[
```

```
  (1 - 2 zm - g1[[i]] * zm + zm^2), {i, n1}];

pp = lp[fs, fc, n];

res[x_] = N[zrs[zeros, nz] *
      (1 - zm) ^ (n - 2 * nz) / pp /. zm -> x];
Print[res[zm]];
Print["Nyquest gain = ", res[-1]];
ww = N[2 * π * I / fs];
Print["power to 20k = ", 10 * Log[10,
    NIntegrate[Abs[res[Exp[ww * x]]] ^2,
      {x, 20, 20000}] / (fs / 2)]];
Plot[20 * Log[10, Abs[res[Exp[ww * x]]]],
  {x, 0, 25000}];

d1 :=
 Together[y /. Solve[Flatten[y == y8 + no /.
 Solve[y8 == 1 / (1 - zm) *
               (-c[8] * zm * y + 1 / (1 - zm) *
                  (y6 - c[7] * zm * y + y8 *
                     zeros[[3]] *
                     zm)),
          y8] /.
 Solve[y6 == 1 / (1 - zm) *
              (-c[6] * zm * y + 1 / (1 - zm) *
                 (y4 - c[5] * zm * y + y6 *
                    zeros[[2]] *
                    zm)),
         y6] /.
 Solve[y4 == 1 / (1 - zm) *
             (-c[4] * zm * y + 1 / (1 - zm) *
```

FIG. 9B

```
                (y2 - c[3] * zm * y + y4 *
                   zeros[[1]] * zm)),
          y4] /.
  Solve[y2 == 1 / (1 - zm) *
              (-c[2] * zm * y + 1 / (1 - zm) *
                 (c[1] * x - c[1] * zm * y)),
         y2]]
  , y]] /; ((n == 8) && (nz == 333));

d1 :=
  Together[y /. Solve[Flatten[y == y8 + no /.
  Solve[y8 == 1 / (1 - zm) *
                 (-c[8] * zm * y + y7), y8] /.
  Solve[y7 == 1 / (1 - zm) *
                (-c[7] * zm * y + 1 / (1 - zm) *
                   (y5 - c[6] * zm * y + y7 *
                      zeros[[3]] *
                      zm)),
           y7] /.
  Solve[y5 == 1 / (1 - zm) *
               (-c[5] * zm * y + 1 / (1 - zm) *
                  (y3 - c[4] * zm * y + y5 *
                     zeros[[2]] *
                     zm)),
          y5] /.
  Solve[y3 == 1 / (1 - zm) *
              (-c[3] * zm * y + 1 / (1 - zm) *
                 (y1 - c[2] * zm * y + y3 *
                    zeros[[1]] * zm)),
          y3] /.
  Solve[y1 == 1 / (1 - zm) *
```

```
            (c[1] * x - c[1] * zm * y), y1]]
  , y]] /; ((n == 8) && (nz == 3));

d1 :=
 Together[y /. Solve[Flatten[y == y7 + no /.
 Solve[y7 == 1 / (1 - zm) *
            (-c[7] * zm * y + 1 / (1 - zm) *
               (y5 - c[6] * zm * y + y7 *
                  zeros[[3]] *
                  zm)),
         y7] /.
 Solve[y5 == 1 / (1 - zm) *
           (-c[5] * zm * y + 1 / (1 - zm) *
              (y3 - c[4] * zm * y + y5 *
                 zeros[[2]] *
                 zm)),
        y5] /.
 Solve[y3 == 1 / (1 - zm) *
          (-c[3] * zm * y + 1 / (1 - zm) *
             (y1 - c[2] * zm * y + y3 *
                zeros[[1]] * zm)),
       y3] /.
 Solve[y1 == 1 / (1 - zm) *
          (c[1] * x - c[1] * zm * y), y1]]
 , y]] /; ((n == 7) && (nz == 3));

d1 :=
 Together[y /. Solve[Flatten[y == y7 + no /.
 Solve[y7 == 1 / (1 - zm) *
            (-c[7] * zm * y + 1 / (1 - zm) *
               (y5 - c[6] * zm * y + y7 *
```

FIG. 9D

```
                  zeros[[2]] *
                  zm)),
          y7] /.
  Solve[y5 == 1 / (1 - zm) *
            (-c[5] * zm * y + 1 / (1 - zm) *
               (y3 - c[4] * zm * y + y5 *
                  zeros[[1]] *
                  zm)),
         y5]  /.
  Solve[y3 == 1 / (1 - zm) * (-c[3] * zm * y +
             1 / (1 - zm) * (y1 - c[2] * zm * y))
        y3] /.
  Solve[y1 == 1 / (1 - zm) *
           (c[1] * x - c[1] * zm * y), y1]]
  , y]] /; ((n == 7) && (nz == 2));

d1 :=
  Together[y /. Solve[Flatten[y == y6 + no /.
  Solve[y6 == 1 / (1 - zm) *
            (-c[6] * zm * y + 1 / (1 - zm) *
               (y4 - c[5] * zm * y + y6 *
                  zeros[[2]] *
                  zm)),
         y6]  /.
  Solve[y4 == 1 / (1 - zm) *
           (-c[4] * zm * y + 1 / (1 - zm) *
              (y2 - c[3] * zm * y + y4 *
                 zeros[[1]] * zm)),
        y4] /.
  Solve[y2 == 1 / (1 - zm) *
          (-c[2] * zm * y + 1 / (1 - zm) *
```

```
                (c[1] * x - c[1] * zm * y)),
          y2]]
   , y]] /; ((n == 6) && (nz == 2));

  d1nr = d1 /. {x -> 0, no -> 1};
  Print[Factor[Numerator[d1nr]]];
  d1nd = Collect[Denominator[d1nr], zm];
  d1nd = d1nd / (d1nd /. zm -> 0);
  d1ndc = Flatten[
    Table[Coefficient[d1nd, zm^i], {i, n}]];
  bnc = Table[Coefficient[pp, zm^i], {i, n}];
  d1s = Solve[Inner[Equal, d1ndc, bnc, List],
    Table[c[i], {i, n}]];
  d1sr = Together[d1 /. {x -> 1, no -> 0}];
  Print[Together[d1sr /. d1s]];
  sig[x_] := N[(d1sr /. d1s) /. zm -> x];
  Plot[20 * Log[10, Abs[sig[N[Exp[ww * x]]]]],
   {x, 0, 20000}];
  d1s
 ]

o8 = makedsfb[48000 * 8,
  35950, 8, {-2 / 64, -4 / 64, -6 / 64}, 3]
```

$$((1. - 1.\,zm)^2\,(1. - 1.96875\,zm + zm^2)\,(1. - 1.9375\,zm + zm^2)\,(1. - 1.90625\,zm + zm^2))\,/$$
$$(1. - 4.98912\,zm + 11.2784\,zm^2 - 14.9787\,zm^3 + 12.7244\,zm^4 - 7.05708\,zm^5 + 2.48927\,zm^6 - 0.509584\,zm^7 + 0.0462801\,zm^8)$$

Nyquest gain = 4.43361

FIG. 9F

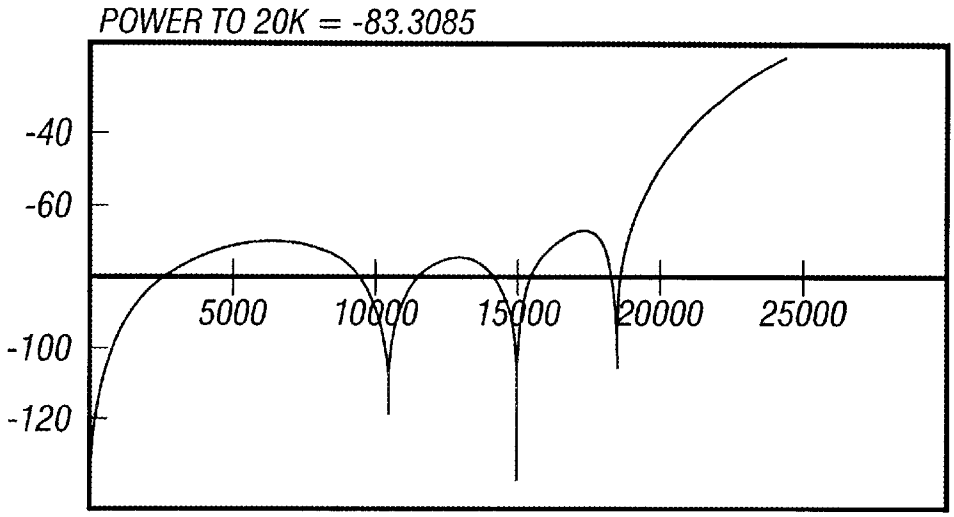
$$\{ -(-1+zm)^2 (16 - 31\,zm + 16\,zm^2)$$
$$(32 - 63\,zm + 32\,zm^2)(32 - 61\,zm + 32\,zm^2) \}$$
$$\{ \{ -63.9369 / (-16384 + 81741.7\,zm - 184786.\,zm^2 + 245410.\,zm^3 - 208476.\,zm^4 + 115623.\,zm^5 - 40784.1\,zm^6 + 8349.03\,zm^7 - 758.253\,zm^8 ) \} \}$$
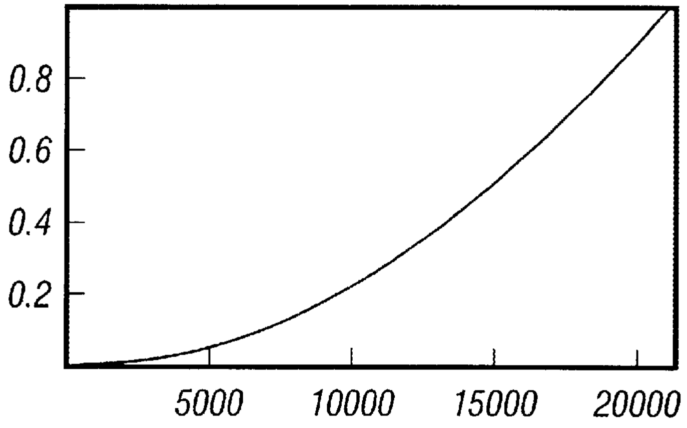
FIG. 9G

```
{{c[1] → 0.0039024, c[2] → 0.015816,
  c[3] → 0.0670501, c[4] → 0.139435,
  c[5] → 0.344191, c[6] → 0.493568,
  c[7] → 0.805699, c[8] → 0.95372}}

makecora[g_, n_, bt_, pat_, tint_] :=
 Module[{ord, nn, nz, mt, mn,
   md, lft, rght, tot, fxcor, bta, er1,
   cor1, cor2, fcor1, fcor2, s10, f, fj},
(*
   Calculate correction
     coefficients for a ds modulator + pwm
   g - rsonator gains
   n - pwm oversample ratio
   bt - feedback gain values
   pat - 0 for right first,
   centered pattern, 1 for left first
   tint - number of trailing integrators
     after the last complex resonator
*)
  ord = Length[bt]; nn = N[n]; nz = Length[g];
  mt =
   Table[If[i >= j, 1, 0], {i, ord}, {j, ord}];
  Do[Module[{j = ord - 2 * (nz - i) - tint},
    Do[mt[[k, j]] += g[[i]], {k, j - 1, ord}];]
   {i, nz}];
  (*Print[MatrixForm[N[mt]]];*)
  (* Make the 2 nth root
    of the state transition matrix *)
  mkrt := Module[{m5, m6, rr, m7, m8, a},
   m5 =
```

FIG. 9H

```
  Table[Flatten[{f[j], fj[j]}], {j, ord}]

 ];

infeed = First[Table[c[i], {i, 8}] /. o8];
Print[infeed];
x64 = makecora[
  {-1 / 32, -2 / 32, -3 / 32}, 64, infeed, 0, 1];
Print[MatrixForm[x64]];
SetDirectory["c:\\hardware\\"];
outs = OpenWrite["dsfb84.cof"];
WriteString[outs, "{\n"];
Do[WriteString[outs, "{"];
 WriteString[outs, CForm[infeed[[i]]], ","];
 Do[
  WriteString[outs, CForm[x64[[i, j]]], ","],
  {j, Length[ x64[[i]] ]}];
 WriteString[outs, "},\n"]
 , {i, Length[infeed]}];
WriteString[outs, "};\n"]; Close[outs];
```

{0.0039024, 0.015816, 0.0670501, 0.139435, 0.344191, 0.493568, 0.805699, 0.95372}

Fit error $\{2.1684\times10^{-18}, 4.38511\times10^{-10}, 8.45447\times10^{-10}, 2.47123\times10^{-8}, 9.07704\times10^{-8}, 3.60814\times10^{-7}, 2.44406\times10^{-7}, 4.8033\times10^{-6}\}$ {0.0039024, 0.015816, 0.0670501, 0.139435, 0.344191, 0.493568, 0.805699, 0.95372}

FIG. 9I

```
 Print[MatrixForm[md[[n/2+1]]]];*)
(*assume a grow on
   right first pattern if pat==0,
 else left first if pat==1,
 make the pulses,
 and then sum appropriately*)
Do[(lft[i] =
   If[EvenQ[n], n / 2 - Floor[(i + pat) / 2],
    (n - 1) / 2 - Floor[(i - 1) / 2]];
  rght[i] = lft[i] + i - 1), {i, 1, n}];
Do[tot[j] = Apply[Plus, Take[md,
    {lft[j] + 1, rght[j] + 1}]], {j, n}];
tot[0] = Table[0, {ord}, {ord}];
(*Print["mid tot ",
  MatrixForm[tot[n/2]/(n/2)]];*)
(*fxcor=Inverse[tot[n/2]/(n/2)]*);
(*Print["midtot^-1",MatrixForm[fxcor]];*)
bta = Table[
   If[i >= j, 1, 0], {i, ord}, {j, ord}].bt;
btb = bta;
(*Print["center ref ",(md[[n/2]].bta+
      md[[n/2+1]].bta)/2];*)
 Do[
 (* now make a list of
   the effective errors, taking the
   half width pulse as a reference *)
 er1 = Table[
   (tot[i] - tot[Floor[n / 2]] * i / n * 2) . btb +
    btb * i, {i, 0, n}];
 (*er1=Table[(tot[i]).btb,{i,0,n}];*)
 (*Print[MatrixForm[er1]];*)
```

FIG. 9J

```
(*Extract the actual corrections
  in a form ready to correlate*)
Do[cor1[j] =
  Table[{i / nn, er1[[i + 1]][[j]] / nn},
   {i, 2 - Mod[n, 2], nn, 2}],
 {j, ord}];
(*Print[cor1[2]];*)
(*Fit the data to polynimoial functions*)
Do[fcor1[j] = Fit[cor1[j],
   Table[x^i, {i, 0, 3}], x], {j, ord}];
(*Do[Print[fcor1[j]],{j,ord}];*)
(* now for the jitter terms *)
Do[cor2[j] = Table[{i / nn,
     (er1[[i + 1]][[j]] / nn -
       (fcor1[j] /. x -> i / nn))},
     {i, 1 + Mod[n, 2], nn - 1, 2}], {j, ord}];
Do[fcor2[j] = Fit[cor2[j],
   Table[x^i, {i, 1, 3}], x], {j, ord}];
(*Do[Print[fcor2[j]],{j,ord}];*)
(*find
  effective gain at center pulse width*)
sl0 = Table[D[fcor1[j] + .5 * fcor2[j], x] /.
   x -> .5, {j, ord}];
btb = bta + btb - sl0;
(*Print[bta,sl0,btb];*)
, {5}]; (*end of iterate for bt update*)
(*find the error in the aproximate fit*)
Do[erfit[j] = Table[
   (er1[[i + 1]][[j]] / nn) -
    (fcor1[j] /. x -> i / nn ) -
```

FIG. 9K

```
        (fcor2[j] /. x -> i / nn ) * Mod[n + i, 2],
      {i, 0, nn}], {j, ord}];
   (*Do[ListPlot[erfit[j]],{j,ord}];*)
   Print["Fit error ",
    Table[Max[Abs[erfit[i]]], {i, ord}]];
 (*Make the differences*)
   Do[fcor1[j] = fcor1[j] - fcor1[j - 1];
    fcor2[j] = fcor2[j] - fcor2[j - 1],
    {j, ord, 2, -1}];
 (*Extract the meaningful
     part of the data, and scale.
   The f functions are scaled relative
     to full scale (input of 0 to 1),
     the fj fuctions relative to one step =
     full scale/n, (input of 0-1) *)
 (*  Do[f[j]=Chop[Table[Coefficient[
         fcor1[j],x^i],{i,1,3}]],
     {j,ord}];*)
   Do[f[j] = Chop[Table[Coefficient[
        (fcor1[j] * 2 /. x -> (y + 1) / 2), y^i],
       {i, 1, 3}]],
    {j, ord}];
   Do[fj[j] = Chop[Table[Coefficient[
         fcor2[j], x^i] * nn, {i, 1, 3}]],
    {j, ord}];
   (*Plot[fcor1[ord],{x,0,1}];*)
   (*Plot[(fcor1[ord]*2/.x->(y+1)/2),
     {y,-1,1}];*)
   Print[Table[D[((fcor1[i] + fcor2[i] / 2) * 2 /.
         x -> (y + 1) / 2), y] /. y -> 0,
     {i, ord}]];
```

FIG. 9L

```
      Table[If[i == j, 1, If[i > j, a[i - j], 0]],
       {i, ord}, {j, ord}];
    m6 = MatrixPower[m5, 2 * n];
    rr = NSolve[
       Table[m6[[ord, i]] == 1, {i, ord - 1}],
     Table[a[i], {i, ord - 1}] ];
    m7 = First[m5 /. rr];
    Do[Module[{j = ord - 2 * (nz - i) - tint},
       m7[[j, j]] = 1 + g[[i]] / (2 * nn);
       m7[[j - 1, j]] = g[[i]] / (2 * nn);],
      {i, nz}];
    (*Print[MatrixForm[m7]];*)
    (*Print[
       MatrixForm[MatrixPower[m7,2*n]]];*)
    m8 = Module[{t = m7}, Do[t = t + (mt . Inverse[
                 MatrixPower[t, 2 * n - 1]] - t) /
             (2 * nn),
        {25}];
       t];
    (*Print[MatrixForm[m8]];*)
    m8
   ];
   mn = mkrt;
   (*Print["nth power of mn",
     MatrixForm[MatrixPower[mn,2*n]]];*)
   (*Make the powers of the state matrix,
    for time slots 0-n-1 *)
 (*  *)
   md = Table[
     MatrixPower[mn, -i], {i, 1 - n, n - 1, 2}];
   (*Print[MatrixForm[md[[n/2]]]]·
```

FIG. 9M

| | | | |
|---|---|---|---|
| 0.0039024 | 0 | 0 | |
| 0.0158219 | -0.000019316 | $-6.43427\times10^{-6}$ | -0.00075392 |
| 0.067124 | 0.0000565573 | 0.0000188395 | -0.0094629 |
| 0.139625 | 0.000176986 | 0.0000587558 | -0.0244287 |
| 0.344942 | 0.00204842 | 0.000682144 | -0.0959928 |
| 0.494856 | 0.0039867 | 0.00132619 | -0.164619 |
| 0.808773 | 0.0154134 | 0.00514387 | -0.390626 |
| 0.958585 | 0.0327607 | 0.010966 | -0.613624 |

```
/*************************************************
*******

Feedback 8th order pwm stage
Demonstrates non-linear correaction techniques
Copyright AudioLogic 1998

This version JLM 7 January 1999

*************************************************
*******/


#include <stdlib.h>
#include <stdio.h>
#include <math.h>
#include <except.h>
#include <conio.h>

//#define max 8388608
//#define mbits 24
//#define max 16777216
//#define mbits 25
//#define max 33554432
//#define mbits 26
//#define max 67108864
//#define mbits 27
//#define max 134217728
//#define mbits 28
#define max 536870912
#define mbits 30
void srfft1( double *xr, double *xi, int logm); //
standard fft, real imaginary, log2 of length
double db(double x){if (x>1.e-50)return
10*log10(x); else return -999.;}
inline long sat(long x){return x>max?max:(x<-max?-
max:x);}

FILE *fout,*fdata;
```

FIG. 10A

```
float pattern[129][128]; //pattern number, time
step
float patternr[129][128]; //reversed
int pwm_over_bits,pwm_over,pat_len,sub_sin;
long z0,z1,z2,z3,z4,z5,z6,z7;
int z9,patsel;
long
fb0[2][257],fb1[2][257],fb2[2][257],fb3[2][257],fb4
[2][257],fb5[2][257],fb6[2][257],fb7[2][257];
long center;
int q_align;
float dither_level;
long dither_bits;
int pass;

void setup_dac();
void reset_dac();
void run_dac( long in, double * out);

void main(){
   if((fout = fopen("dac.txt","w")) == NULL){
    printf("can't open dac.txt for output\n");
      exit(1);
   }
   if((fdata = fopen("dac.prn","w")) == NULL){
    printf("can't open dac.prn for output\n");
      exit(1);
   }
   double pi=4.*atan(1.);
///////////////////////////////////////////////////
////////////////
///////////////////////////////////////////////////
////////////////
//
//  PARAMETER SETUPS
//
///////////////////////////////////////////////////
////////////////
///////////////////////////////////////////////////
////////////////
   double fs=384000.;
```

FIG. 10B

```
   double bw = 20000.;
    pwm_over_bits = 7;
   int log_samps=13;
    double *out,*outi,*window;
   double *insine;
   double tone_freq = 5500.;
   double tone_db;
   sub_sin=0;

    int samps = 1<<log_samps;
   int log_fft=log_samps+pwm_over_bits;


//
////////////////////////////////////////////////////////
////////////////
////////////////////////////////////////////////////////
////////////////

   setup_dac();
   fprintf(fout,"pwm_over = %d center= %lX dither
max= %lX\n",pwm_over,center,dither_bits);
   fprintf(fout,"sd rate = %e pwm rate = %e
\n",fs,fs*pwm_over);
   int cycles = .5+ (float)samps * tone_freq/fs;
   tone_freq = cycles *fs / samps;
   fprintf(fout,"cycles= %d tone frequency = %f
\n",cycles,tone_freq);
   int bin_bw = bw/fs*samps;
   fprintf (fout,"bandwidth= %f (= bin
%d)\n",bw,bin_bw);

   fprintf(fout,"\n");


//   for(int i=0;i<=pwm_over;i++)printf("cor[%2d]=
%lX\n",i,cor[i]);
    int run_len = samps * pwm_over;
   int out_samps = samps+4;
   int out_len = out_samps*pwm_over+pat_len;
   try{out=new double[out_len];}
```

FIG. 10C

```
   catch (xalloc) {
        fprintf(fout,"Could not allocate output.
Bye ...\n");
      exit(-1);
   }
    try{outi=new double[run_len];}
   catch (xalloc) {
        fprintf(fout,"Could not allocate imaginary.
Bye ...\n");
      exit(-1);
   }

    try{window=new double[run_len];}
   catch (xalloc) {
        fprintf(fout,"Could not allocate window.
Bye ...\n");
      exit(-1);
   }
// make windowing
        double ww = pi*2./run_len;
        for(int i=0;i<run_len;i++)
        window[i]=.5*(1.-cos(ww*i));

   double w=2.*pi/samps*cycles;
   try{insine=new double[out_samps];}
   catch (xalloc) {
        fprintf(fout,"Could not allocate sine. Bye
...\n");
      exit(-1);
   }
   for(int i=0;i<out_samps;i++){
    insine[i] = sin(i*w)*max;
   }

//////////////////////////////////////////////
// Loop on pass
//////////////////////////////////////////////

    for(pass=0; pass <= 3;pass+=1){
//  for(pass=10; pass <= 14 ;pass++){
        fprintf(fout,"\n pass = %d \n",pass);
```

FIG. 10D

```
        printf("pass = %d \n",pass);

//////////////////////////////
// Loop on various levels
//////////////////////////////

        for(tone_db=-3;tone_db > -61;tone_db -= 3){
      printf("level = %5.0f",tone_db);

// run modulator
           double tone_level = pow(10,tone_db/20.);
           reset_dac();
           int index=0;
         printf(" run ");
           for(int i=0;i<out_samps;i++){
            run_dac(tone_level *
insine[i],out+index);
              index+=pwm_over;
           }
// do windowing
            for(int i=0;i<run_len;i++){
            out[i]=out[i+4*pwm_over]*window[i];
            outi[i]=0.;
          }
// do ftt
           printf("doing fft ");
           srfftl(out, outi, log_fft);
           printf("output powers\n");
           double scale =
4./((float)run_len*run_len)*2.663576;
           double np=0.,sp=0.;
           for(int i=0;i<=bin_bw*8;i++){

    out[i]=(out[i]*out[i]+outi[i]*outi[i])*scale;
              if( (i>0) && ( i!=cycles) && (
i!=cycles+1) && ( i!=cycles-1) && (i<= bin_bw))
np+=out[i];
              if(( i==cycles) || ( i==cycles+1) ||
( i==cycles-1)) sp+=out[i];
           }
```

FIG. 10E

```
            double
h2=(2*cycles>bin_bw)?0.:out[cycles*2]+out[cycles*2+
1]+out[cycles*2-1];
            double
h3=(3*cycles>bin_bw)?0.:out[cycles*3]+out[cycles*3+
1]+out[cycles*3-1];
            double
h4=(4*cycles>bin_bw)?0.:out[cycles*4]+out[cycles*4+
1]+out[cycles*4-1];
            double
h5=(5*cycles>bin_bw)?0.:out[cycles*5]+out[cycles*5+
1]+out[cycles*5-1];
             np-=h2+h3+h4+h5;
            fprintf(fout,"level = %6.2f 1st power =
%6.2f noise = %7.2f 2nd = %7.2f 3rd = %7.2f 4th =
%7.2f 5th = %7.2f\n",

    2*db(tone_level),db(sp),db(np),db(h2),db(h3),db
(h4),db(h5));

        if(tone_db < -59.9)for(int
i=0;i<=bin_bw*8;i++)fprintf(fdata,"%f\n",2*db(out[i
]));
        }
    }

/////////////////////
// end of pass loop
/////////////////////



   printf("done\n");
//   int dummy=getch();

}

void run_dac( long in, double * out){
// feedback type modulator
    z0 = sat(z0 + (in>>4)  + fb0[0][z9]);//Leading
c0
```

FIG. 10F

```
   z1 = sat((z0>>1) + z1 - (z2 >> 4) + (fb1[0]
[z9]) );
   z2 = sat((z1>>1) + z2 + fb2[0][z9]);
   z3 = sat((z2>>1) + z3 -(z4>>3) + fb3[0][z9]);
   z4 = sat((z3>>1) + z4 + fb4[0][z9]);
   z5 = sat(z4 + z5 - (z6>>5)*3 + fb5[0][z9]);
   z6 = sat(z5 + z6 + fb6[0][z9]);
   z7 = sat(z6 + z7 + fb7[0][z9]);

   for(int i=0;i<pat_len;i++)
    out[i] = pattern[z9][i];
   if(sub_sin)for(int i=0;i<pwm_over;i++)out[i]-
=in/(float)max;
   long t =((z7 ) >> q_align) + center;
   z9 = (t>pwm_over) ? (pwm_over):((t<0)?0:t);
}
void setup_dac(){
    pwm_over = 1 << pwm_over_bits;
    center = pwm_over/2;
   q_align = mbits - pwm_over_bits;
   dither_bits = (1 << q_align ) - 1;
   pat_len=pwm_over;
   fprintf(fout,"8th order feeback type
modulator\n");
    fprintf(fout,"pass 0 - no correction
enabled\n");
    fprintf(fout,"pass 1 - jitter correction
enabled\n");
    fprintf(fout,"pass 2 - jitter and squared
correction enabled\n");
    fprintf(fout,"pass 3 - reference modulator only
- no pwm\n");
}

void reset_dac(){
    int i,j;
   double cg[8]={16,8,4,2,1,1,1,1};// stage gains
    double c[8][7]=//correction coefficients
//order is normal feedback, x,x^2,x^3 feedback,
x,x^2,x^3 jitter
```

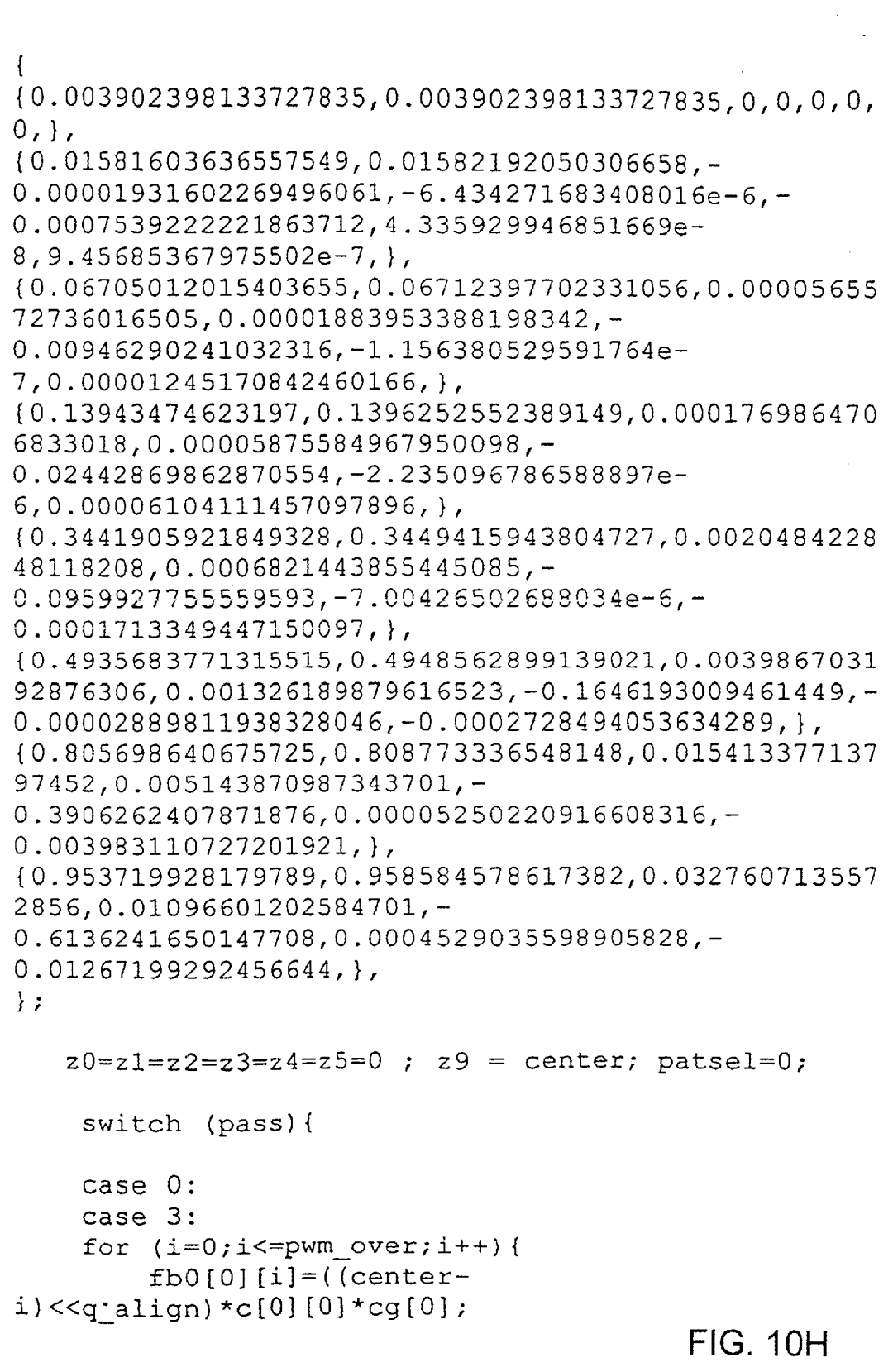

```
{
{0.003902398133727835,0.003902398133727835,0,0,0,0,
0,},
{0.01581603636557549,0.0158219205030665 8,-
0.0000193160226949606 1,-6.434271683408016e-6,-
0.0007539222221863712,4.335929946851669e-
8,9.45685367975502e-7,},
{0.06705012015403655,0.06712397702331056,0.00005655
72736016505,0.0000188395338819834 2,-
0.0094629024103231 6,-1.156380529591764e-
7,0.0000124517084246016 6,},
{0.13943474623197,0.1396252552389149,0.000176986470
6833018,0.0000587558496795009 8,-
0.02442869862870554,-2.235096786588897e-
6,0.0000610411145709789 6,},
{0.3441905921849328,0.3449415943804727,0.0020484228
48118208,0.000682144385544508 5,-
0.0959927755559593,-7.004265026880 34e-6,-
0.0001713349447150097,},
{0.4935683771315515,0.4948562899139021,0.0039867031
92876306,0.001326189879616523,-0.1646193009461449,-
0.0000288981193832804 6,-0.000272849405363428 9,},
{0.805698640675725,0.808773336548148,0.015413377137
97452,0.005143870987343701,-
0.3906262407871876,0.0000525022091660831 6,-
0.003983110727201921,},
{0.953719928179789,0.958584578617382,0.032760713557
2856,0.01096601202584701,-
0.6136241650147708,0.000452903559890582 8,-
0.0126719929245664 4,},
};

   z0=z1=z2=z3=z4=z5=0 ; z9 = center; patsel=0;

    switch (pass){

    case 0:
    case 3:
    for (i=0;i<=pwm_over;i++){
        fb0[0][i]=((center-
i)<<q_align)*c[0][0]*cg[0];
```

FIG. 10H

```
        fb1[0][i]=((center-
i)<<q_align)*c[1][0]*cg[1];
    fb2[0][i]=((center-i)<<q_align)*c[2][0]*cg[2];
    fb3[0][i]=((center-i)<<q_align)*c[3][0]*cg[3];
    fb4[0][i]=((center-i)<<q_align)*c[4][0]*cg[4];
    fb5[0][i]=((center-i)<<q_align)*c[5][0]*cg[5];
    fb6[0][i]=((center-i)<<q_align)*c[6][0]*cg[6];
    fb7[0][i]=((center-i)<<q_align)*c[7][0]*cg[7];
   }
   // no correction
   break;

    case 1:
   // Uses linear jitter term only
       for (i=0;i<=pwm_over;i++){
        double step = (double)(1L<<q_align);
         double full = step*pwm_over/2;
         double f=(double)i/pwm_over;
         double f1=(f-.5)*2.*full;
         double f2=(f-.5)*(f-.5)*4.*full*0.;//off
         double f3=(f-.5)*(f-.5)*(f-
.5)*8.*full*0.;//off

         fb0[0][i]=( - f1*c[0][1] - f2*c[0][2] -
f3*c[0][3] )*cg[0];
         fb1[0][i]=( - f1*c[1][1] - f2*c[1][2] -
f3*c[1][3] )*cg[1];
         fb2[0][i]=( - f1*c[2][1] - f2*c[2][2] -
f3*c[2][3] )*cg[2];
         fb3[0][i]=( - f1*c[3][1] - f2*c[3][2] -
f3*c[3][3] )*cg[3];
         fb4[0][i]=( - f1*c[4][1] - f2*c[4][2] -
f3*c[4][3] )*cg[4];
         fb5[0][i]=( - f1*c[5][1] - f2*c[5][2] -
f3*c[5][3] )*cg[5];
         fb6[0][i]=( - f1*c[6][1] - f2*c[6][2] -
f3*c[6][3] )*cg[6];
         fb7[0][i]=( - f1*c[7][1] - f2*c[7][2] -
f3*c[7][3] )*cg[7];

         double j1=f*(i%2)*step;
```

FIG. 10I

```
        double j2=f*f*(i%2)*step*0.;//off
        double j3=f*f*f*(i%2)*step*0.;//off

        fb1[0][i] += ( - j1 *c[1][4] - j2*c[1][5]
- j3*c[1][6])*cg[1];
        fb2[0][i] += ( - j1 *c[2][4] - j2*c[2][5]
- j3*c[2][6])*cg[2];
        fb3[0][i] += ( - j1 *c[3][4] - j2*c[3][5]
- j3*c[3][6])*cg[3];
        fb4[0][i] += ( - j1 *c[4][4] - j2*c[4][5]
- j3*c[4][6])*cg[4];
        fb5[0][i] += ( - j1 *c[5][4] - j2*c[5][5]
- j3*c[5][6])*cg[5];
        fb6[0][i] += ( - j1 *c[6][4] - j2*c[6][5]
- j3*c[6][6])*cg[6];
        fb7[0][i] += ( - j1 *c[7][4] - j2*c[7][5]
- j3*c[7][6])*cg[7];
      }
   break;

    case 2:
   default:
   // Uses square and cube spread terms, and linear
jitter term
       for (i=0;i<=pwm_over;i++){
        double step = (double)(1L<<q_align);
         double full = step*pwm_over/2;
         double f=(double)i/pwm_over;
         double f1=(f-.5)*2.*full;
         double f2=(f-.5)*(f-.5)*4.*full*1.;
         double f3=(f-.5)*(f-.5)*(f-.5)*8.*full*1;

         fb0[0][i]=( - f1*c[0][1] - f2*c[0][2] -
f3*c[0][3] )*cg[0];
         fb1[0][i]=( - f1*c[1][1] - f2*c[1][2] -
f3*c[1][3] )*cg[1];
         fb2[0][i]=( - f1*c[2][1] - f2*c[2][2] -
f3*c[2][3] )*cg[2];
         fb3[0][i]=( - f1*c[3][1] - f2*c[3][2] -
f3*c[3][3] )*cg[3];
```

```
        fb4[0][i]=( - f1*c[4][1] - f2*c[4][2] -
f3*c[4][3] )*cg[4];
        fb5[0][i]=( - f1*c[5][1] - f2*c[5][2] -
f3*c[5][3] )*cg[5];
        fb6[0][i]=( - f1*c[6][1] - f2*c[6][2] -
f3*c[6][3] )*cg[6];
        fb7[0][i]=( - f1*c[7][1] - f2*c[7][2] -
f3*c[7][3] )*cg[7];

        double j1=f*(i%2)*step;
        double j2=f*f*(i%2)*step*1.;//off
        double j3=f*f*f*(i%2)*step*1.;//off

        fb1[0][i] += ( - j1 *c[1][4] - j2*c[1][5]
- j3*c[1][6])*cg[1];
        fb2[0][i] += ( - j1 *c[2][4] - j2*c[2][5]
- j3*c[2][6])*cg[2];
        fb3[0][i] += ( - j1 *c[3][4] - j2*c[3][5]
- j3*c[3][6])*cg[3];
        fb4[0][i] += ( - j1 *c[4][4] - j2*c[4][5]
- j3*c[4][6])*cg[4];
        fb5[0][i] += ( - j1 *c[5][4] - j2*c[5][5]
- j3*c[5][6])*cg[5];
        fb6[0][i] += ( - j1 *c[6][4] - j2*c[6][5]
- j3*c[6][6])*cg[6];
        fb7[0][i] += ( - j1 *c[7][4] - j2*c[7][5]
- j3*c[7][6])*cg[7];
      }
   break;

   }
// make output patterns
    switch(pass){
   case 3:
       for (i=0;i<=pwm_over;i++){
            double t[128];
        for(j=0;j<pwm_over;j++){
//          t[j]=(float)(i-center)/(float)center;
            t[j]=j<center?(float)(i-
center)/(float)center*2.:0;
//          t[j]=j==0?2*(i-center):0;
```

FIG. 10K

```
            }
                for(j=0;j<pwm_over;j++){
                    patternr[i][j]=pattern[i][j]=
                    patternr[i][j]=pattern[i][j]=t[j];
                }
        }
    break;
    default:
            for (i=0;i<=pwm_over;i++){
                double t[128];
            for(j=0;j<pwm_over/2;j++){
                t[j]=(i/2 + j)>=(pwm_over/2)?1:-1;
                t[pwm_over-1-j]=((i+1)/2 +
j)>=(pwm_over/2)?1:-1;
            }
                for(j=0;j<pwm_over;j++){
                    patternr[i][pwm_over-1-
j]=pattern[i][j]=t[j];
                }
            }
    break;

    }

}
```

```
8th order feeback type modulator
pass 0 - no correction enabled
pass 1 - jitter correction enabled
pass 2 - jitter and squared correction enabled
pass 3 - reference modulator only - no pwm
pwm_over = 128 center= 40 dither max= 7FFFFF
sd rate = 3.840000e+05 pwm rate = 4.915200e+07
cycles= 117 tone frequency = 5484.375000
bandwidth= 20000.000000 (= bin 426)


 pass = 0
level =  -3.00 1st power =  -2.93 noise =  -75.26
2nd =  -71.64 3rd =  -81.23 4th = -999.00 5th = -
999.00
level =  -6.00 1st power =  -5.93 noise =  -74.37
2nd =  -78.01 3rd =  -92.28 4th = -999.00 5th = -
999.00
level =  -9.00 1st power =  -8.93 noise =  -75.35
2nd =  -84.43 3rd =  -98.48 4th = -999.00 5th = -
999.00
level = -12.00 1st power = -11.93 noise =  -75.12
2nd =  -88.06 3rd = -100.45 4th = -999.00 5th = -
999.00
level = -15.00 1st power = -14.93 noise =  -75.88
2nd =  -95.36 3rd =  -95.74 4th = -999.00 5th = -
999.00
level = -18.00 1st power = -17.93 noise =  -75.04
2nd =  -98.23 3rd =  -96.12 4th = -999.00 5th = -
999.00
level = -21.00 1st power = -20.93 noise =  -75.90
2nd =  -94.82 3rd =  -97.95 4th = -999.00 5th = -
999.00
level = -24.00 1st power = -23.93 noise =  -75.58
2nd =  -98.34 3rd =  -93.60 4th = -999.00 5th = -
999.00
level = -27.00 1st power = -26.93 noise =  -75.51
2nd =  -95.70 3rd =  -93.22 4th = -999.00 5th = -
999.00
```

FIG. 10M

```
level = -30.00 1st power = -29.93 noise =  -75.36
2nd =  -94.90 3rd =  -96.37 4th = -999.00 5th = -
999.00
level = -33.00 1st power = -32.93 noise =  -75.16
2nd = -105.15 3rd =  -93.03 4th = -999.00 5th = -
999.00
level = -36.00 1st power = -35.93 noise =  -75.55
2nd =  -95.06 3rd =  -88.75 4th = -999.00 5th = -
999.00
level = -39.00 1st power = -38.92 noise =  -75.63
2nd =  -98.80 3rd = -101.99 4th = -999.00 5th = -
999.00
level = -42.00 1st power = -41.93 noise =  -75.80
2nd =  -96.38 3rd =  -92.49 4th = -999.00 5th = -
999.00
level = -45.00 1st power = -44.93 noise =  -75.58
2nd = -103.71 3rd =  -93.44 4th = -999.00 5th = -
999.00
level = -48.00 1st power = -47.93 noise =  -74.85
2nd =  -96.03 3rd =  -96.04 4th = -999.00 5th = -
999.00
level = -51.00 1st power = -50.91 noise =  -75.27
2nd =  -93.68 3rd =  -94.29 4th = -999.00 5th = -
999.00
level = -54.00 1st power = -53.91 noise =  -75.70
2nd =  -95.47 3rd =  -96.66 4th = -999.00 5th = -
999.00
level = -57.00 1st power = -56.90 noise =  -75.85
2nd =  -93.86 3rd =  -93.33 4th = -999.00 5th = -
999.00
level = -60.00 1st power = -59.92 noise =  -75.67
2nd =  -97.67 3rd =  -92.44 4th = -999.00 5th = -
999.00

 pass = 1
level =  -3.00 1st power =  -2.93 noise = -121.11
2nd =  -71.81 3rd =  -83.27 4th = -999.00 5th = -
999.00
level =  -6.00 1st power =  -5.93 noise = -122.60
2nd =  -77.81 3rd =  -92.27 4th = -999.00 5th = -
999.00
```

FIG. 10N

```
level =  -9.00 1st power =  -8.93 noise = -124.54
2nd =  -83.81 3rd = -101.19 4th = -999.00 5th = -
999.00
level = -12.00 1st power = -11.93 noise = -123.60
2nd =  -89.82 3rd = -110.48 4th = -999.00 5th = -
999.00
level = -15.00 1st power = -14.93 noise = -123.70
2nd =  -95.82 3rd = -118.97 4th = -999.00 5th = -
999.00
level = -18.00 1st power = -17.93 noise = -124.36
2nd = -101.82 3rd = -128.60 4th = -999.00 5th = -
999.00
level = -21.00 1st power = -20.93 noise = -122.81
2nd = -107.81 3rd = -137.44 4th = -999.00 5th = -
999.00
level = -24.00 1st power = -23.93 noise = -124.07
2nd = -113.86 3rd = -144.00 4th = -999.00 5th = -
999.00
level = -27.00 1st power = -26.93 noise = -123.92
2nd = -119.89 3rd = -144.31 4th = -999.00 5th = -
999.00
level = -30.00 1st power = -29.93 noise = -123.82
2nd = -125.46 3rd = -146.18 4th = -999.00 5th = -
999.00
level = -33.00 1st power = -32.93 noise = -124.27
2nd = -131.98 3rd = -143.40 4th = -999.00 5th = -
999.00
level = -36.00 1st power = -35.93 noise = -124.78
2nd = -138.20 3rd = -151.57 4th = -999.00 5th = -
999.00
level = -39.00 1st power = -38.93 noise = -124.69
2nd = -143.18 3rd = -152.14 4th = -999.00 5th = -
999.00
level = -42.00 1st power = -41.93 noise = -125.62
2nd = -145.11 3rd = -143.94 4th = -999.00 5th = -
999.00
level = -45.00 1st power = -44.93 noise = -123.44
2nd = -152.03 3rd = -148.53 4th = -999.00 5th = -
999.00
```

FIG. 10O level = -48.00 1st power = -47.93 noise = -123.60
2nd = -150.51 3rd = -147.51 4th = -999.00 5th = -
999.00
level = -51.00 1st power = -50.93 noise = -124.51
2nd = -151.07 3rd = -148.10 4th = -999.00 5th = -
999.00
level = -54.00 1st power = -53.93 noise = -123.54
2nd = -157.52 3rd = -144.69 4th = -999.00 5th = -
999.00
level = -57.00 1st power = -56.93 noise = -124.51
2nd = -160.28 3rd = -148.88 4th = -999.00 5th = -
999.00
level = -60.00 1st power = -59.93 noise = -124.20
2nd = -155.37 3rd = -145.79 4th = -999.00 5th = -
999.00 pass = 2
level = -3.00 1st power = -2.93 noise = -124.77
2nd = -133.32 3rd = -131.80 4th = -999.00 5th = -
999.00
level = -6.00 1st power = -5.93 noise = -126.24
2nd = -139.21 3rd = -140.37 4th = -999.00 5th = -
999.00
level = -9.00 1st power = -8.93 noise = -125.32
2nd = -145.52 3rd = -147.27 4th = -999.00 5th = -
999.00
level = -12.00 1st power = -11.93 noise = -123.75
2nd = -151.71 3rd = -146.02 4th = -999.00 5th = -
999.00
level = -15.00 1st power = -14.93 noise = -125.75
2nd = -155.50 3rd = -149.96 4th = -999.00 5th = -
999.00
level = -18.00 1st power = -17.93 noise = -124.87
2nd = -160.82 3rd = -154.42 4th = -999.00 5th = -
999.00
level = -21.00 1st power = -20.93 noise = -125.31
2nd = -161.35 3rd = -151.38 4th = -999.00 5th = -
999.00
level = -24.00 1st power = -23.93 noise = -123.71
2nd = -164.46 3rd = -147.59 4th = -999.00 5th = -
999.00

FIG. 10P

```
level = -27.00 1st power = -26.93 noise = -125.38
2nd = -164.72 3rd = -150.13 4th = -999.00 5th = -
999.00
level = -30.00 1st power = -29.93 noise = -125.07
2nd = -168.69 3rd = -148.02 4th = -999.00 5th = -
999.00
level = -33.00 1st power = -32.93 noise = -125.27
2nd = -163.37 3rd = -154.14 4th = -999.00 5th = -
999.00
level = -36.00 1st power = -35.93 noise = -125.01
2nd = -165.63 3rd = -151.06 4th = -999.00 5th = -
999.00
level = -39.00 1st power = -38.93 noise = -126.29
2nd = -159.28 3rd = -150.79 4th = -999.00 5th = -
999.00
level = -42.00 1st power = -41.93 noise = -123.97
2nd = -159.92 3rd = -145.18 4th = -999.00 5th = -
999.00
level = -45.00 1st power = -44.93 noise = -125.37
2nd = -164.16 3rd = -146.95 4th = -999.00 5th = -
999.00
level = -48.00 1st power = -47.93 noise = -124.51
2nd = -169.33 3rd = -147.47 4th = -999.00 5th = -
999.00
level = -51.00 1st power = -50.93 noise = -125.84
2nd = -161.93 3rd = -150.08 4th = -999.00 5th = -
999.00
level = -54.00 1st power = -53.93 noise = -125.44
2nd = -164.21 3rd = -156.46 4th = -999.00 5th = -
999.00
level = -57.00 1st power = -56.93 noise = -125.01
2nd = -163.60 3rd = -146.47 4th = -999.00 5th = -
999.00
level = -60.00 1st power = -59.93 noise = -125.38
2nd = -168.39 3rd = -160.22 4th = -999.00 5th = -
999.00

 pass = 3
level =  -3.00 1st power =  -2.93 noise = -128.23
2nd = -173.89 3rd = -148.11 4th = -999.00 5th = -
999.00
```

FIG. 10Q level = -6.00 1st power = -5.93 noise = -124.94
2nd = -170.73 3rd = -148.05 4th = -999.00 5th = -
999.00
level = -9.00 1st power = -8.93 noise = -126.69
2nd = -178.51 3rd = -148.96 4th = -999.00 5th = -
999.00
level = -12.00 1st power = -11.93 noise = -128.03
2nd = -169.93 3rd = -156.85 4th = -999.00 5th = -
999.00
level = -15.00 1st power = -14.93 noise = -127.86
2nd = -168.81 3rd = -153.54 4th = -999.00 5th = -
999.00
level = -18.00 1st power = -17.93 noise = -127.79
2nd = -177.71 3rd = -153.54 4th = -999.00 5th = -
999.00
level = -21.00 1st power = -20.93 noise = -129.87
2nd = -170.37 3rd = -148.29 4th = -999.00 5th = -
999.00
level = -24.00 1st power = -23.93 noise = -128.03
2nd = -171.76 3rd = -150.81 4th = -999.00 5th = -
999.00
level = -27.00 1st power = -26.93 noise = -127.99
2nd = -174.96 3rd = -147.62 4th = -999.00 5th = -
999.00
level = -30.00 1st power = -29.93 noise = -127.13
2nd = -179.45 3rd = -150.33 4th = -999.00 5th = -
999.00
level = -33.00 1st power = -32.93 noise = -126.81
2nd = -172.76 3rd = -153.03 4th = -999.00 5th = -
999.00
level = -36.00 1st power = -35.93 noise = -126.68
2nd = -174.14 3rd = -149.38 4th = -999.00 5th = -
999.00
level = -39.00 1st power = -38.93 noise = -128.09
2nd = -175.14 3rd = -153.80 4th = -999.00 5th = -
999.00
level = -42.00 1st power = -41.93 noise = -126.97
2nd = -172.59 3rd = -149.88 4th = -999.00 5th = -
999.00

FIG. 10R

```
level = -45.00 1st power = -44.93 noise = -126.58
2nd = -174.56 3rd = -155.89 4th = -999.00 5th = -
999.00
level = -48.00 1st power = -47.93 noise = -127.47
2nd = -172.52 3rd = -152.36 4th = -999.00 5th = -
999.00
level = -51.00 1st power = -50.93 noise = -128.94
2nd = -168.17 3rd = -158.35 4th = -999.00 5th = -
999.00
level = -54.00 1st power = -53.93 noise = -128.24
2nd = -175.72 3rd = -153.20 4th = -999.00 5th = -
999.00
level = -57.00 1st power = -56.93 noise = -126.20
2nd = -176.55 3rd = -150.72 4th = -999.00 5th = -
999.00
level = -60.00 1st power = -59.93 noise = -127.46
2nd = -173.08 3rd = -166.56 4th = -999.00 5th = -
999.00
```

```
/**************************************************
*******

Delta sigme format conversion
Demonstrates non-linear correaction techniques
Copyright AudioLogic 1998

This version JLM 22 December 1998


Program generates a test sequence with a single bit
delta-sigma
modulator, and then uses another modulator to
convert that to
a multi level quantizer format

This demonstration uses an initial FIR filter, and
then corrects off of the
moments of the vector of 8 input samples.

All of the calculations can be performed by simple
table lookup,
they are calculated out here to show the detail.

Not all of the correction terms are used, as the
"only" 130+dB SNR is targeted
**************************************************
*******/


#include <stdlib.h>
#include <stdio.h>
#include <math.h>
#include <except.h>
#include <conio.h>

void srfftl( double *xr, double *xi, int logm); //
standard fft library routine
double db(double x){if (x>1.e-50)return
10*log10(x); else return -999.;}
```

FIG. 14A

```
inline double sat(double x){return x>1?1:(x<-1?-
1:x);}
double lp8(char * x){
/*  static double c[17]={
    0.0576,    0.0351,    0.0438,    0.0523,
0.0600,    0.0667,    0.0717,
    0.0748,    0.0759,    0.0748,    0.0717,
0.0667,    0.0600,    0.0523,
    0.0438,    0.0351,    0.0576};
*/
    static double c[33]={
   -0.0058,    0.0018,    0.0032,    0.0057,
0.0091,    0.0134,    0.0185,
    0.0242,    0.0304,    0.0369,    0.0434,
0.0495,    0.0550,    0.0597,
    0.0631,    0.0653,    0.0661,    0.0653,
0.0631,    0.0597,    0.0550,
    0.0495,    0.0434,    0.0369,    0.0304,
0.0242,    0.0185,    0.0134,
    0.0091,    0.0057,    0.0032,    0.0018,
0.0058};
    return
    ((int)x[0]+(int)x[32])*c[0]+
    ((int)x[1]+(int)x[31])*c[1]+
    ((int)x[2]+(int)x[30])*c[2]+
    ((int)x[3]+(int)x[29])*c[3]+
    ((int)x[4]+(int)x[28])*c[4]+
    ((int)x[5]+(int)x[27])*c[5]+
    ((int)x[6]+(int)x[26])*c[6]+
    ((int)x[7]+(int)x[25])*c[7]+
    ((int)x[8]+(int)x[24])*c[8]+
    ((int)x[9]+(int)x[23])*c[9]+
    ((int)x[10]+(int)x[22])*c[10]+
    ((int)x[11]+(int)x[21])*c[11]+
    ((int)x[12]+(int)x[20])*c[12]+
    ((int)x[13]+(int)x[19])*c[13]+
    ((int)x[14]+(int)x[18])*c[14]+
    ((int)x[15]+(int)x[17])*c[15]+
    x[16]*c[16];
}
```

FIG. 14B

```
FILE *fout,*fdata;

double z0,z1,z2,z3,z4,z5,z6,z7;
double z9;
long center,mlq_bits;
int mlq;
int pass,sub_dc;
double dc;
double *m0,*m1,*m2,*m3;

void setup_dac();
void reset_dac();
void run_dac( double m0, double m1,double m2,
double m3, double * out);

void main(){
   if((fout = fopen("convert.txt","w")) == NULL){
    printf("can't open dac.txt for output\n");
      exit(1);
   }
   if((fdata = fopen("dac.prn","w")) == NULL){
    printf("can't open dac.prn for output\n");
      exit(1);
   }
   double pi=4.*atan(1.);
////////////////////////////////////////////////////////
////////////////
////////////////////////////////////////////////////////
////////////////
//
//  PARAMETER SETUPS
//
////////////////////////////////////////////////////////
////////////////
////////////////////////////////////////////////////////
////////////////
   double fs=768000.;//16fs source
   double bw = 20000.;
    mlq_bits = 6;
   int log_samps=18;
   int in_over=8;//128fs destination
```

FIG. 14C

```
 double *out,*outi,*window;
 char *in_ds;
float *in_fds;
dc=.05;
sub_dc=0;

 int samps = 1<<log_samps;
int in_samps= samps*in_over;
int log_fft=log_samps;


//
/////////////////////////////////////////////////////
////////////////
/////////////////////////////////////////////////////
////////////////

   setup_dac();
   fprintf(fout,"ds out rate = %e ds in rate = %e
\n",fs,fs*in_over);
   int bin_bw = bw/fs*samps;
   fprintf (fout,"bandwidth= %f (= bin
%d)\n",bw,bin_bw);

   fprintf(fout,"\n");


   try{out=new double[samps];}
   catch (xalloc) {
        fprintf(fout,"Could not allocate output.
Bye ...\n");
      exit(-1);
   }
    try{outi=new double[samps];}
   catch (xalloc) {
        fprintf(fout,"Could not allocate imaginary.
Bye ...\n");
      exit(-1);
   }

    try{window=new double[samps];}
```

FIG. 14D

```
   catch (xalloc) {
        fprintf(fout,"Could not allocate window.
Bye ...\n");
      exit(-1);
   }
// make windowing
        double ww = pi*2./samps;
        for(int i=0;i<samps;i++)
        window[i]=.5*(1.-cos(ww*i));

////////////////////////////////////////////////////
////////////////////////////////////////////////////
////////////////////////////////////////////////////
////////////////////////////////////////////////////
// make input
////////////////////////////////////////////////////
////////////////////////////////////////////////////
////////////////////////////////////////////////////
////////////////////////////////////////////////////
   try{in_ds=new char[in_samps+64];}
   catch (xalloc) {
        fprintf(fout,"Could not allocate input. Bye
...\n");
      exit(-1);
   }
   double
in_int1=0.,in_int2=0.,in_int3=0.,in_int4=0.,in_int5
=0.,in_int6=0.;
   int fb=0;
   double avg=0.;
   for(int i=0;i<in_samps+64;i++){
    in_int1+=dc-fb;
      in_int2+=in_int1;
      in_int3+=in_int2-.0008*in_int4;
      in_int4+=in_int3;
      in_int5+=in_int4-.0015*in_int6;
      in_int6+=in_int5;
      fb=(
        in_int1*.55+in_int2*.19+in_int3*.045+

in_int4*.0076+in_int5*.0008+in_int6*.00005+
```

FIG. 14E

```
          (rand()&255)/512.+dc)>.25?1:-1;
        in_ds[i]=(char)fb;
//      in_ds[i]=(i%10)?0:1;
      avg+=(double)fb/in_samps;
   }
   fprintf(fout,"dc= %f  avg of input ds stream =
%f\n",dc,avg);
// do rough lp filtering of ds stream
   try{in_fds=new float[in_samps];}
   catch (xalloc) {
        fprintf(fout,"Could not allocate filtered
input. Bye ...\n");
      exit(-1);
   }
   for(int
i=0;i<in_samps;i++)in_fds[i]=lp8(in_ds+i);
//
// generate moments
//
   try{m0=new double[samps];}
   catch (xalloc) {
        fprintf(fout,"Could not allocate m0. Bye
...\n");
      exit(-1);
   }
   try{m1=new double[samps];}
   catch (xalloc) {
        fprintf(fout,"Could not allocate m0. Bye
...\n");
      exit(-1);
   }
   try{m2=new double[samps];}
   catch (xalloc) {
        fprintf(fout,"Could not allocate m0. Bye
...\n");
      exit(-1);
   }
   try{m3=new double[samps];}
   catch (xalloc) {
        fprintf(fout,"Could not allocate m0. Bye
...\n");
```

FIG. 14F

```
        exit(-1);
    }

    {
     float *ip;
        int i;
        for(i=0,ip=in_fds ;i<samps;i++,ip+=in_over){

     m0[i]=(ip[0]+ip[1]+ip[2]+ip[3]+ip[4]+ip[5]+ip[6
]+ip[7])*.125;
            m1[i]=(  (ip[7]-ip[0])*7. +
                       (ip[6]-ip[1])*5. +
                       (ip[5]-ip[2])*3. +
                       (ip[4]-ip[3])
                   )/64.;
            m2[i]=(  (ip[7]+ip[0])*49. +
                       (ip[6]+ip[1])*25. +
                       (ip[5]+ip[2])*9. +
                       (ip[4]+ip[3])
                   )/512.;
            m3[i]=(  (ip[7]+ip[0])*343. +
                       (ip[6]+ip[1])*125. +
                       (ip[5]+ip[2])*27. +
                       (ip[4]+ip[3])
                   )/4096.;
        }
    }


/////////////////////////////////////////////////
// Loop on pass
/////////////////////////////////////////////////

    for(pass=0; pass <= 2 ;pass+=1){
        fprintf(fout,"\n pass = %d \n",pass);
        printf("pass = %d \n",pass);


// run modulator
        reset_dac();
```

FIG. 14G

```
        for(int i=0;i<samps;i++){
         run_dac(m0[i],m1[i],m2[i],m3[i],out+i);
        }
       for(int i=0;i<100;i++)printf("%6.4f
",out[i]);
// do windowing
         for(int i=0;i<samps;i++){
         out[i]=out[i]*window[i];
         outi[i]=0.;
       }
// do ftt
        printf("doing fft\n");
        srfft1(out, outi, log_fft);
        printf("output powers\n");
        double scale =
4./((double)samps*samps)*2.663576;
        double np=0.;
//       double dco=out[0]/samps*2.;
        for(int i=0;i<=bin_bw*2;i++){

     out[i]=(out[i]*out[i]+outi[i]*outi[i])*scale;
           if ((i>3) && i<bin_bw) np+=out[i];
        }
        fprintf(fout,"noise = %10.5f\n",db(np) );
       if(pass == 0) for(int i=0;i<=bin_bw;i++)
         fprintf(fdata,"%10.4f\n",db(out[i]));

    }

/////////////////////
// end of pass loop
/////////////////////



   printf("done\n");
//   int dummy=getch();

}
```

```
//////////////////////////////////////////////////////
///////////////////////
//
//
// Simulate an 8th order, feedback style modulator,
with feedforward
// Corrections of the input stream.
//
//
//////////////////////////////////////////////////////
///////////////////////
void run_dac( double m0, double m1, double m2,
double m3, double * out){

    double c[8]=
{0.000304617,0.00284984,0.0138321,0.0546036,
    0.147472,0.349142,0.600712,0.879486};

    switch (pass){

   case 0:
   default:
    z0 = sat(z0 + (m0 - z9)*c[0]);
   z1 = sat(z0 + z1 - z9*c[1]);
   z2 = sat(z1 + z2 - z3*.0078125-z9*c[2]);
   z3 = sat(z2 + z3 - z9*c[3]);
   z4 = sat(z3 + z4 - z5*.015625 - z9*c[4]);
   z5 = sat(z4 + z5 - z9*c[5]);
   z6 = sat(z5 + z6 - z7*.0234375 - z9*c[6]);
   z7 = sat(z6 + z7 - z9*c[7]);
   break;

   case 1:
    z0 = sat(z0 + (m0 - z9)*c[0]);
   z1 = sat(z0 + z1 - z9*c[1]+c[0]*(m1*-.5));
   z2 = sat(z1 + z2 - z3*.0078125-
z9*c[2]+c[0]*(m1*-.249));
   z3 = sat(z2 + z3 - z9*c[3]+c[0]*(m1*-.146));
   z4 = sat(z3 + z4 - z5*.015625 - z9*c[4]);
   z5 = sat(z4 + z5 - z9*c[5]);
   z6 = sat(z5 + z6 - z7*.0234375 - z9*c[6]);
```

FIG. 14I

```
    z7 = sat(z6 + z7 - z9*c[7]);
    break;

    case 2:
     z0 = sat(z0 + (m0 - z9)*c[0]);
    z1 = sat(z0 + z1 - z9*c[1]+c[0]*(m1*-.5));
    z2 = sat(z1 + z2 - z3*.0078125-z9*c[2]+c[0]*
     (m0*-.04+m1*-.249+m2*.124+m3*.0002));
    z3 = sat(z2 + z3 - z9*c[3]+c[0]*
     (m0*-.04+m1*-.146+m2*.125+m3*-.021));
    z4 = sat(z3 + z4 - z5*.015625 - z9*c[4]+c[0]*
     (m0*-.036+m1*-.094+m2*.108+m3*-.031));
    z5 = sat(z4 + z5 - z9*c[5]);
    z6 = sat(z5 + z6 - z7*.0234375 - z9*c[6]);
    z7 = sat(z6 + z7 - z9*c[7]);
    break;
    }
    z9 =floor(z7 * mlq + (rand() &
255)/256.)/(double)mlq;
     out[0] = z9;

}
void setup_dac(){
     mlq = 1 << (mlq_bits-1);
     fprintf(fout,"pass 0 no correction \n");
     fprintf(fout,"pass 1 m1 correction\n");
     fprintf(fout,"pass 2 selective m1,m2,m3
correction\n");
}

void reset_dac(){
    z0=z1=z2=z3=z4=z5=z6=z7=0 ; z9 = 0;
     switch (pass){

     case 0:
     case 1:
     case 2:
     default:

    break;
    }
```

```
pass 0 no correction
pass 1 m1 correction
pass 2 selective m1,m2,m3 correction
ds out rate = 7.680000e+05 ds in rate =
6.144000e+06
bandwidth= 20000.000000 (= bin 6826)

dc= 0.050000  avg of input ds stream = 0.050001

 pass = 0
noise =  -89.56616

 pass = 1
noise = -127.41747

 pass = 2
noise = -140.89739
```

FIG. 14L

METHODS AND APPARATUS FOR CORRECTION OF HIGHER ORDER DELTA SIGMA CONVERTERS

This application claims the benefit of U.S. Provisional Application No. 60/121,269, filed Feb. 23, 1999, and U.S. Provisional Application No. 60/124,631, filed Mar. 16, 1999.

BACKGROUND OF INVENTION

1. Field of the Invention

The present invention relates to correction techniques for delta sigma converters for audio digital to analog (D/A) and analog to digital (A/D) conversion applications.

2. Description of Prior Art

Delta Sigma D/A and A/D converters have become the standard devices for data conversion in audio applications. The purpose of using Delta Sigma converters in audio applications is to predict and reduce in-band quantization error, which causes distortion, with feedback loops. A good overview of the theory of Delta Sigma data converters is given in the book 'Delta Sigma Data Converters', by Norsworthy, Schreier, and Temes (IEEE Press, 1997).

U.S. Pat. No. 5,815,102 by the present inventor (incorporated herein by reference) teaches methods for correcting delta sigma quantizers to account for distortion introduced by PWM on the output. In FIG. 1 (taken from that patent), a typical first order delta sigma quantizer is shown. The purpose of this quantizer, in a D/A converter, is to convert a high resolution digital signal having several bits to a single bit representation which can be accurately converted to analog. Most delta sigma digital to analog designs operate in the normal sampled time $\text{domain}_{13}$ that is, with the assumption that all signals are sampled at a fixed frequency f, and the value at each sample represents an impulse response with a finite area and an infinitesimally small width. The invention taught in U.S. Pat. No. 5,815,102 used some generalizations of this assumption to include converters using output signals having variable pulse width. One such application is noise shaped pulse width modulation (PWM).

FIG. 2, also taken from U.S. Pat. 5,815,102 shows a demodulator which might be used in an oversampling D/A converter. High resolution data 202 (for example, 12 to 20 bit data) enter delta sigma converter 204. The sample rate of this data has already been increased from the low clock rate required to code the data to a medium clock rate used to clock the delta sigma converter (interpolation techniques for oversampling data are well understood by experts in this field). The ratio of the low to the medium clock speed is typically 32 (for example, the clock speed might be increased from 16 kHz to 1 MHz). Delta sigma modulator 204 is clocked by medium clock 213 to generate medium resolution data (for example, 2 to 5 bit words). Duty cycle demodulator 208 is clocked by medium clock 213 and high clock 212. The frequency of the high clock is typically a multiple of the medium clock rate (for example, to 16 MHz from 1 MHz). The output of duty cycle demodulator 208 is low resolution data (1 or 2 bit words) at the high clock rate. In this figure, the 0.5 medium clock (clocking at half the rate of the medium clock) is used for alternating output data formats in systems using pulse width modulation. Other systems of this type are described in works by Craven and by Risbo. See, for example, "Toward the 24-bit DAC: Novel Noise-Shaping Topologies Incorporating Correction for the Nonlinearity in a PWM OutPut Stage" by Peter Craven, J. Audio Eng. Soc., Vol. 41, No., 5, May 1993. See also U.S. Pat. Nos. 5,548,286 and 5,784,017 by Craven. See also WO 97/37433 by L. Risbo et al.

Refer now to FIG. 3, showing a generalization of delta sigma noises haping loops 300. Both the signals Y and U are assumed to be instantaneously sampled discrete time signals. It is desirable to remove that restriction, and to allow either or both Y and U to be signals with real width, and, potentially, varying shape.

The case where feedback signal Y is a generalized signal allows for the use of PWM techniques, as described above, as well as compensation for imperfect pulse shaping and inter-symbol interference. In summary, freeing up the limitations on Y allows for converters that can have arbitrary output waveforms from the final low resolution digital to analog converter. There is a need in the art to develop a systematic approach to the optimization of the feedback and correction coefficients for such a system.

There also remains a need to allow U, the input signal, to be a generalized signal. The case where U is a generalized signal is useful for the conversion of one kind of delta sigma stream into another. An interesting example would be the conversion of a 128 Fs one-bit data stream into a 16-bit Fs six-bit stream. This technique would also be useful in applications requiring sample rate conversion.

Finally, there remains a need for systems in which both signals U and Y are not constrained to be impulse sampled systems. Applications include conversion from a delta sigma format into PWM format, and combinations of sample rate conversion with PWM output.

There is a need in the art to generalize this technique to the case where multiple mutually nonlinear functions (MMNFs) are applied to feedback or feed forward terms before they enter the integrators. Freeing this constraint on higher order delta sigma converter designs can permit the output of arbitrary waveforms from the D/A converter.

SUMMARY OF INVENTION

An object of the present invention is to provide a means for the design of delta sigma converters using MMNFs. This invention is a generalization of previous work (U.S. Pat. No. 5,815,102), in which multiples of the same nonlinear function are used as adders at different integrators in a higher order delta sigma converter.

A delta sigma modulator using MMNFs is at least a second order delta sigma modulator having at least two feed forward and/or feedback loops, in which two of the functions applied before summation at the integrators are nonlinear and are not simple multiples of each other. Such a modulator might also be used in a system that takes in input data at a rate higher than the modulator rate, or in one where the sample rate is changed in the delta sigma converter.

The present invention includes a method for using roots of the state transition matrix to calculate MMNFs for application as correction terms in a delta sigma modulator. The feedback functions are then optionally fit to polynomials (rather than implemented in lookup tables), which allow a portable representation of the nonlinear functions. In some cases, where the functions modify the average gain of the feedback loop (affecting the frequency response of the modulator), polynomial calculation can be used iteratively to drive the new system's transfer function toward that of the old loop when a low level signal is applied. This improvement stage can help in high gain or low oversample ratio stages.

A delta sigma modulator according to the present invention is of at least second order, operating at an operating clock rate, and having an input and producing an output in response to the input. It has at least two state variables, a quantizer having an input responsive to one of the state variables and providing a feedback signal and a modulator output signal, two mutually nonlinear function blocks, each applying a nonlinear function to the feedback from the quantizer, to form two mutually nonlinear feedback signals, and two adders for adding one of the nonlinear feedback signals to the input of one of the state variables. The nonlinear functions applied by the function blocks are substantially linear functions when viewed at a clock rate which is a multiple of the operating clock rate.

The nonlinear function blocks may comprise read only memories (look up tables), or blocks for computing powers of the feedback from the quantizer and applying scaling to the powers.

A method according to the present invention for correcting distortion in a delta sigma modulator of at least second order, having at least two state variables responsive to feedback from an output quantizer and operating at an operating clock rate, comprises the steps of determining a system equivalent to the modulator, the system operating at a higher clock rate, the higher clock rate being a multiple of the operating clock rate, wherein the output of the system is substantially linear at the higher clock rate, modeling the response to system operation at the higher clock rate, modelling the correction to be applied to each integrator feedback path at the higher clock rate to correct the modelled distortion, computing the correction to be applied within the modulator at the operating clock rate such that the modulator operating at the operating clock rate substantially matches the operation of the system operating at the higher clock rate in response to the same outputs, and implementing the computed correction by applying at least two mutually nonlinear functions to the feedback from the quantizer, and adding the respective results to at least two state variables.

The step of computing the correction includes the steps of determining the roots of the state transition matrix and computing the mutually nonlinear functions based on the roots.

BRIEF DESCRIPTION OF DRAWINGS

FIG. 9 is a Mathematical implementation of the calculation of MMNF correction terms for a PWM stage.

FIG. 10 is C++ code to simulate an $8^{th}$ order PWM stage, implemented using MMNFs for correction.

FIG. 14 provides C++ code to simulate an $8^{th}$ order feedback modulator, with feed forward correction of the input stream.

DETAILED DESCRIPTION OF THE PREFERRED EMBODIMENTS

FIGS. 5, 7, 8, and 12 show examples of higher order delta sigma modulators according to the present invention. Those skilled in the art will appreciate that these figures are merely illustrative examples of higher order delta sigma modulators, and that there are literally infinite ways to combine and interconnect the elements forming higher order delta sigma modulators (e.g. Integrators, feedforward and feedback loops feeding the integrators, scalars, etc.) The methods described in relation to these examples are general, and may be applied to any higher order delta sigma modulator.

A higher order delta sigma modulator according to the present invention is defined as a delta sigma modulator of at least second order, having at least as many state variables as the order of the modulator, with at least two of the state variables responsive to the quantizer on the output of the modulator and at least two of the state variable being modified by mutually nonlinear, nonzero functions. The mutually nonlinear functions are linear when viewed at a clock rate that is a multiple of the operating clock rate.

Figure 1:
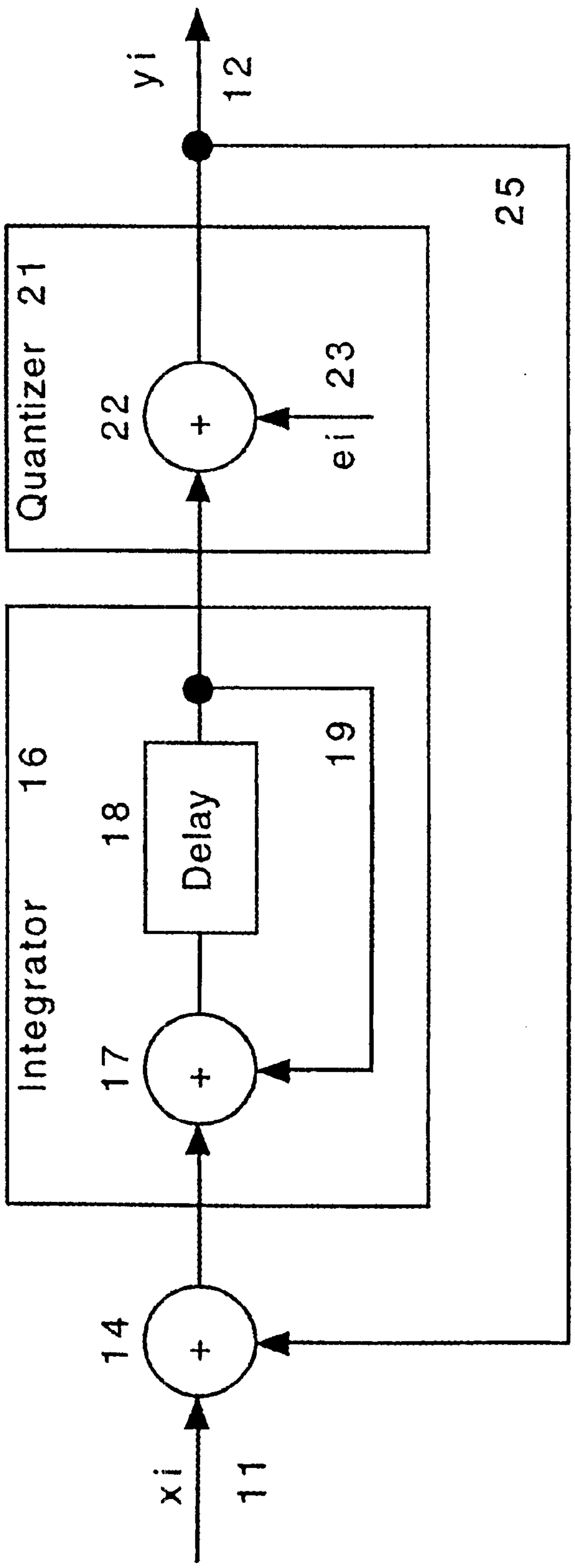
FIG. 1 (Prior Art) shows a well known 1st order delta sigma modulator.
Figure 2:
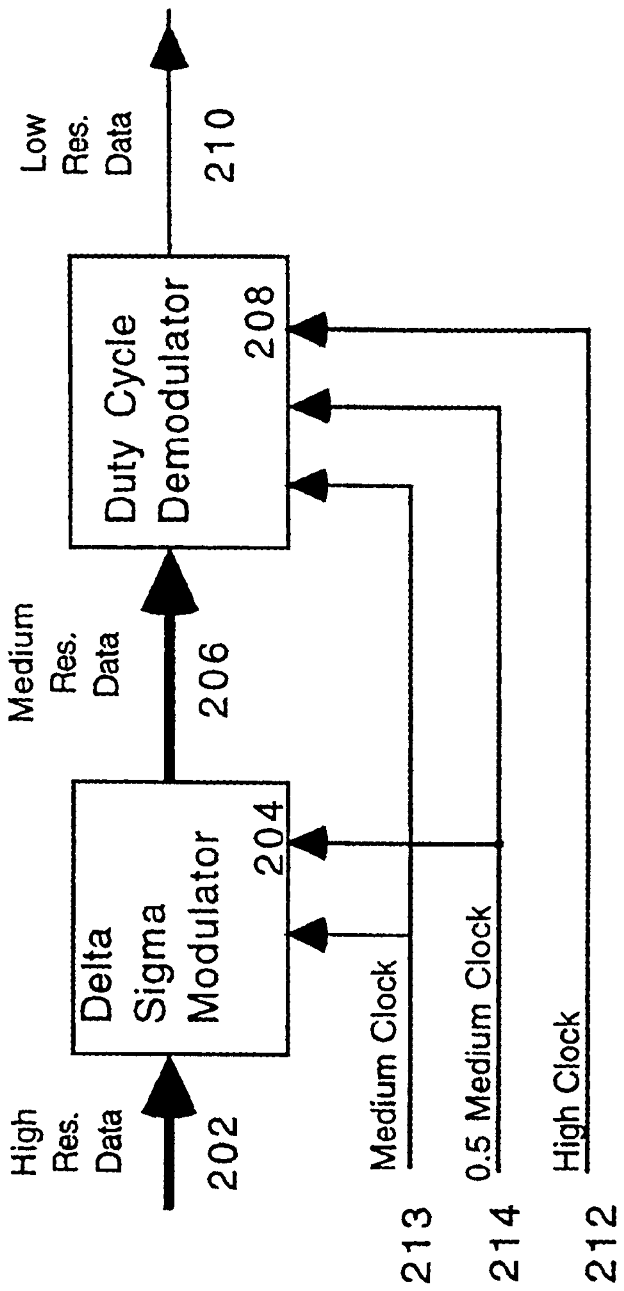
FIG. 2 (Prior Art) shows a demodulator, including a delta sigma converter and a duty cycle demodulator.
Figure 3:
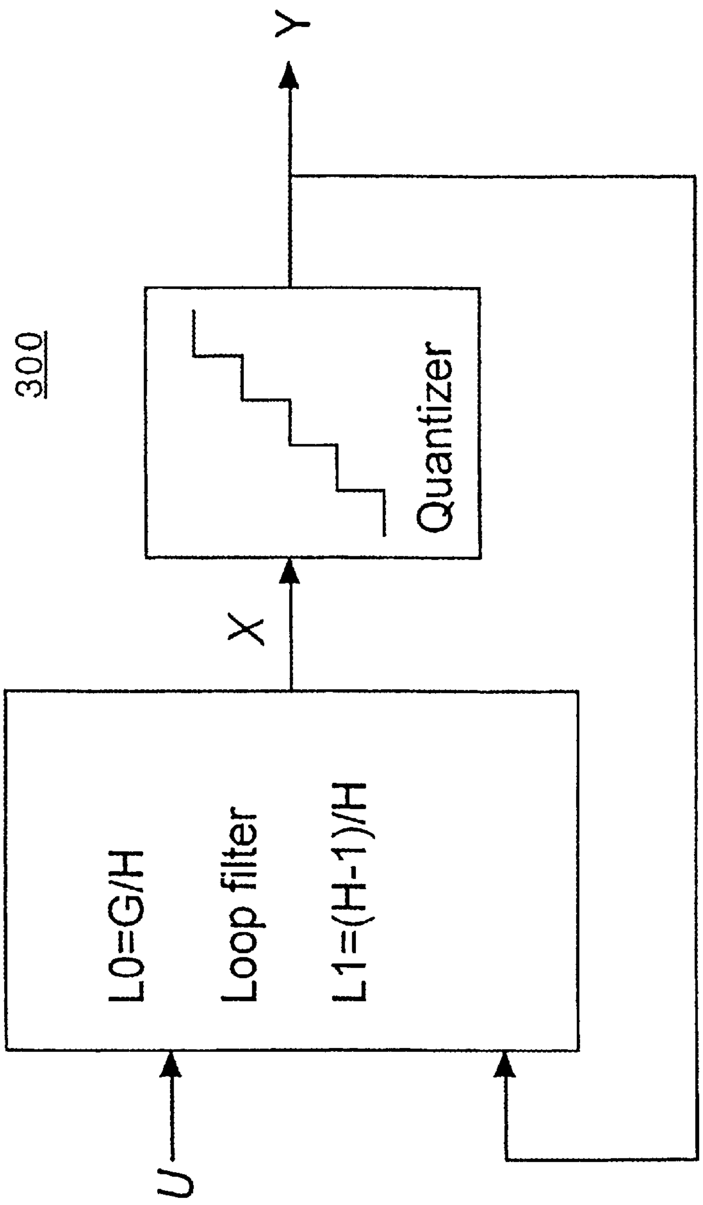
FIG. 3 (Prior Art) is a simplified diagram of a delta sigma noise shaping loop.
Figure 4:
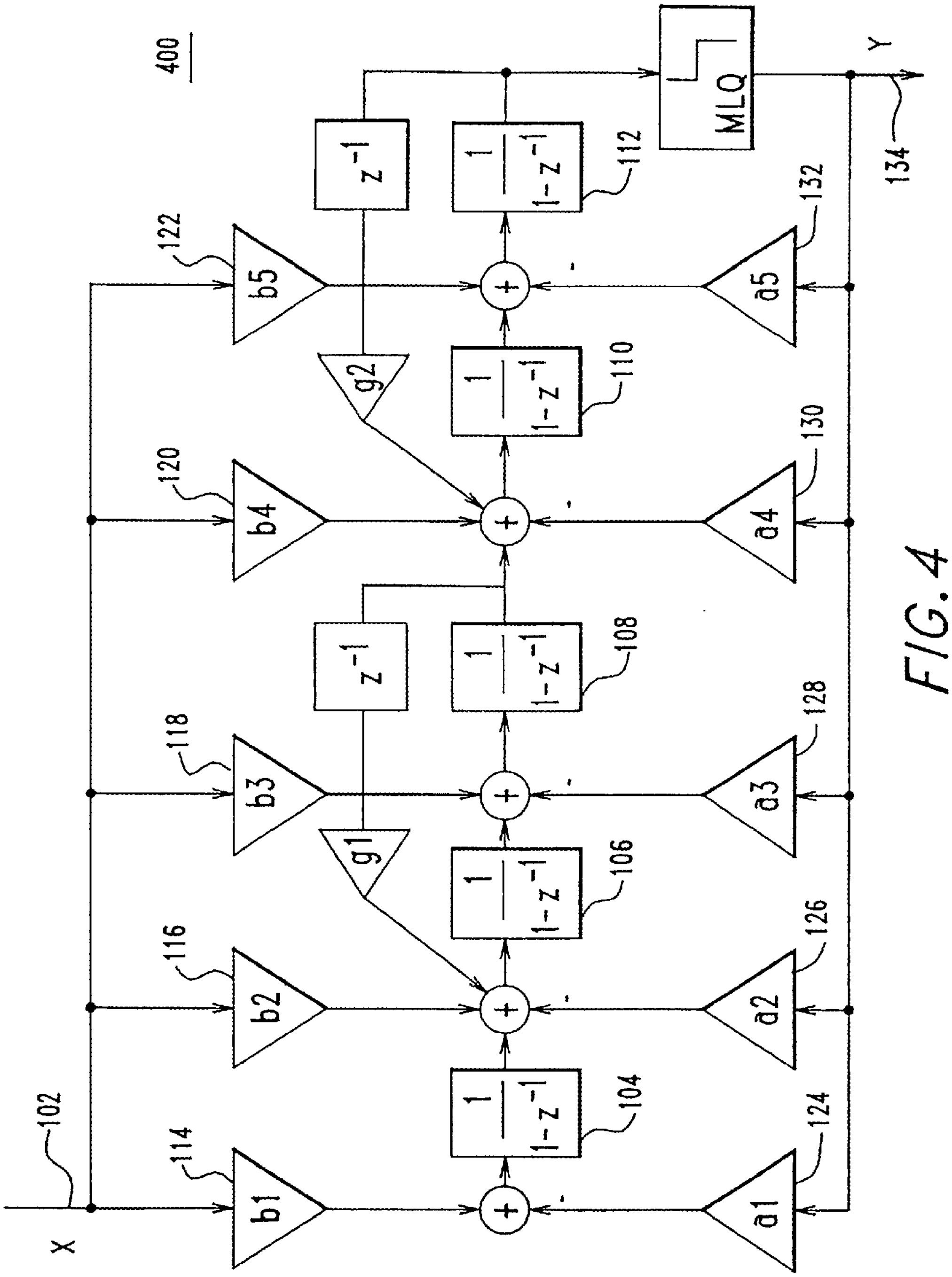
FIG. 4 (Prior Art) shows a fifth-order delta sigma modulator of a well known type.

FIG. 4 shows a $5^{th}$-order delta sigma modulator 400 of a well known type. This sort of modulator is known as a feedback structure. The integrators, with transfer function 1/(1−z^(−1)), are known as "zero delay integrators" since the input will immediately appear at the output. The noise transfer function will have a zero at DC, and complex zero pairs on the unit circle determined by coefficients g1 and g2. The poles of the noise transfer function are set by feedback terms a1, a2, a3, a4, a5. These are normally chosen to produce a Butterworth, or similar, high pass response. Quantizer 140 produces a multilevel output, as would be appropriate for PWM conversion. Input gains b1, b2, b3, b4, and b5 are chosen to determine the in-band frequency response. The text "Delta-sigma Data Converters: Theory, Design and Simulation" provides a good reference for the design of such systems.

Figure 5:
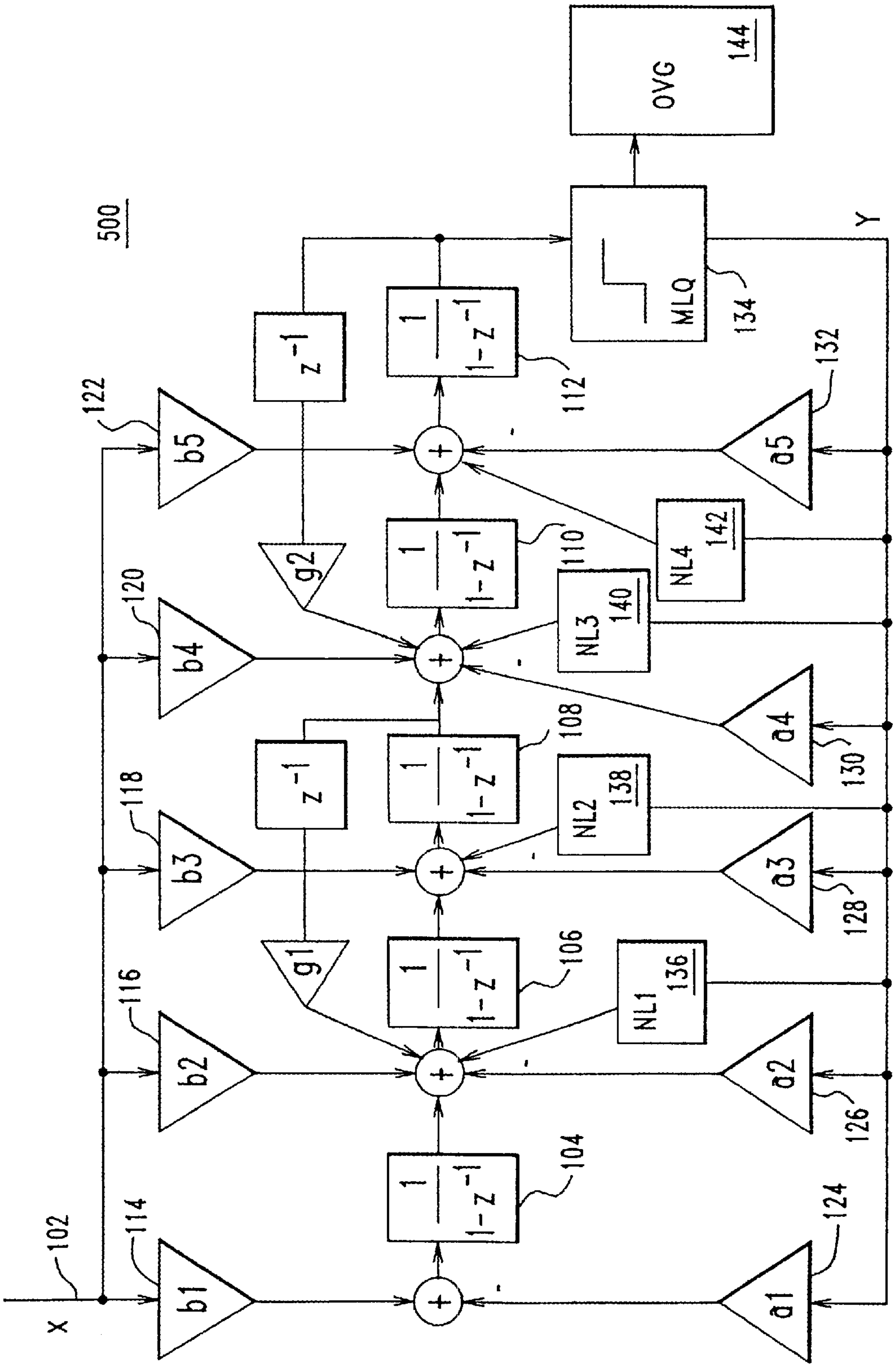
FIG. 5 shows the circuit of FIG. 5, with MMNF elements added to correct for distortion.
Figure 6:
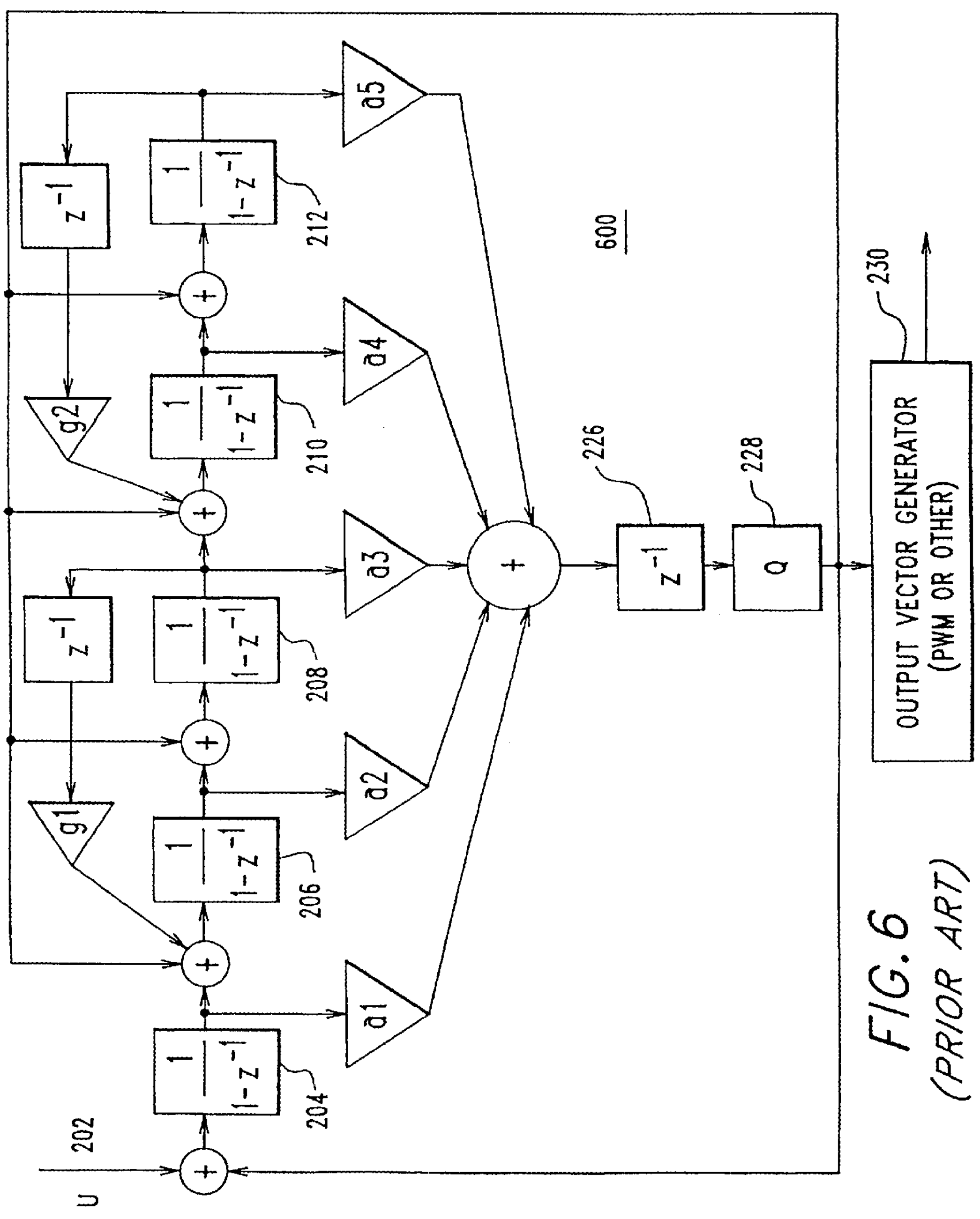
FIG. 6 (Prior Art) shows a feed forward, $5^{th}$-order delta sigma modulator of prior art.
Figure 7:
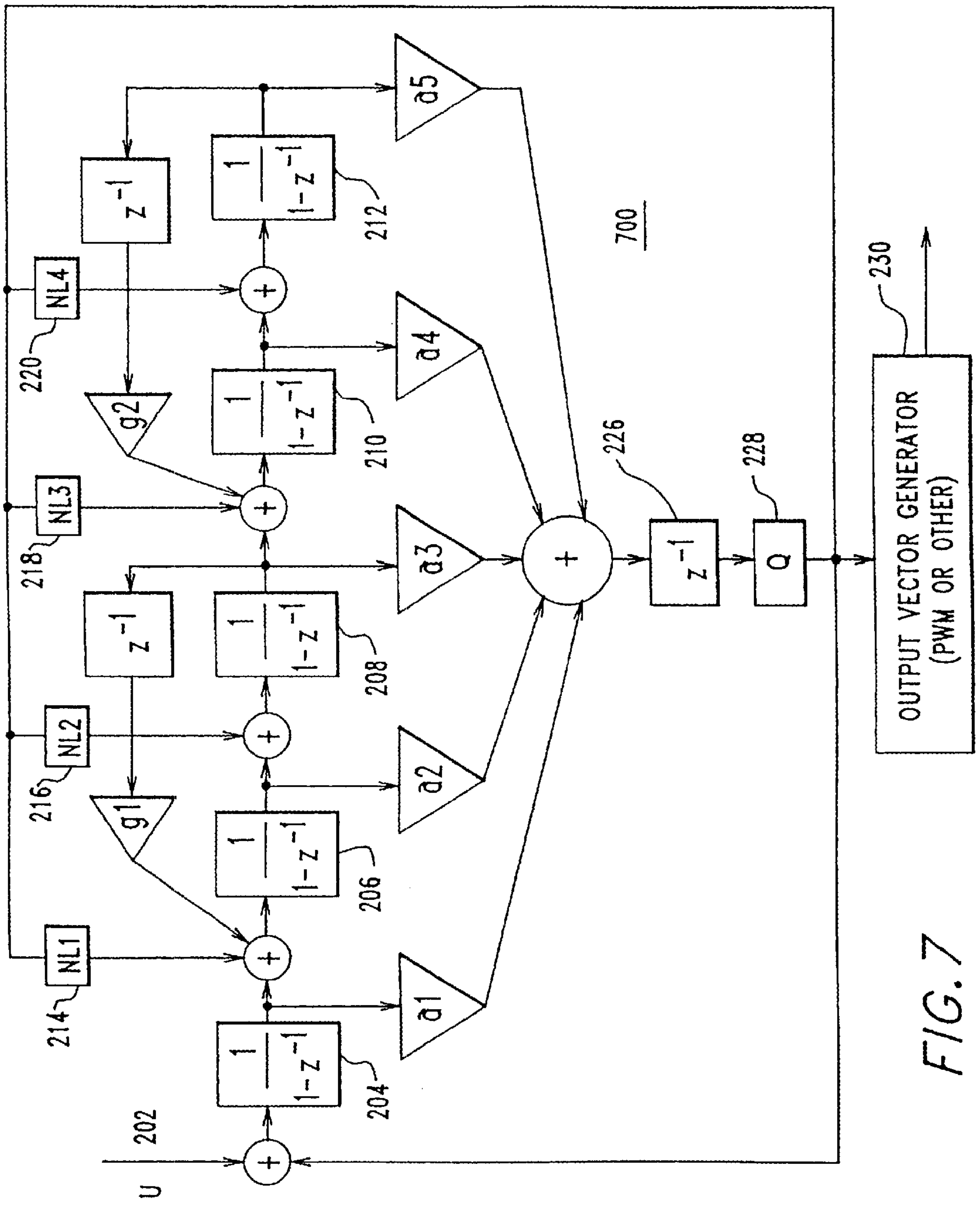
FIG. 7 shows the feed forward delta sigma modulator of FIG. 6 with feedback MMNF correction added.

If such a modulator is combined with a PWM stage, distortion will result. FIG. 5 shows the circuit of FIG. 4 with the MMNL elements NL1 through NL4 (136 through 142) added to correct for distortion, forming corrected delta sigma modulator 500. The output 144 passes through an output vector generator upon leaving the multilevel quantizer 134. FIG. 6 shows a feed forward, $5^{th}$-order modulator of prior art. FIG. 7 shows a feed forward delta sigma modulator 700 with feedback MMNL correction added. The input signal, 202, may be a vector. It enters the delta sigma modulator and passes through integrators 204 through 212. After each integration, the altered data stream is submitted to summation 226. The summed data stream is then passed to quantizer 228.

After the data stream passes through integrators 208 and 212, standard feedback terms 222 and 224 are also fed back into the data stream. After summation and quantization, the quantized output stream is output to a vector generator 230 (for example, to a PWM). It is also subtracted from the input data stream 202, and is fed back after being passed through MMNFs 214 through 220. At least two of the MMNFs 214 through 220 are nonlinear functions which are not multiples of each other.

Figure 8:
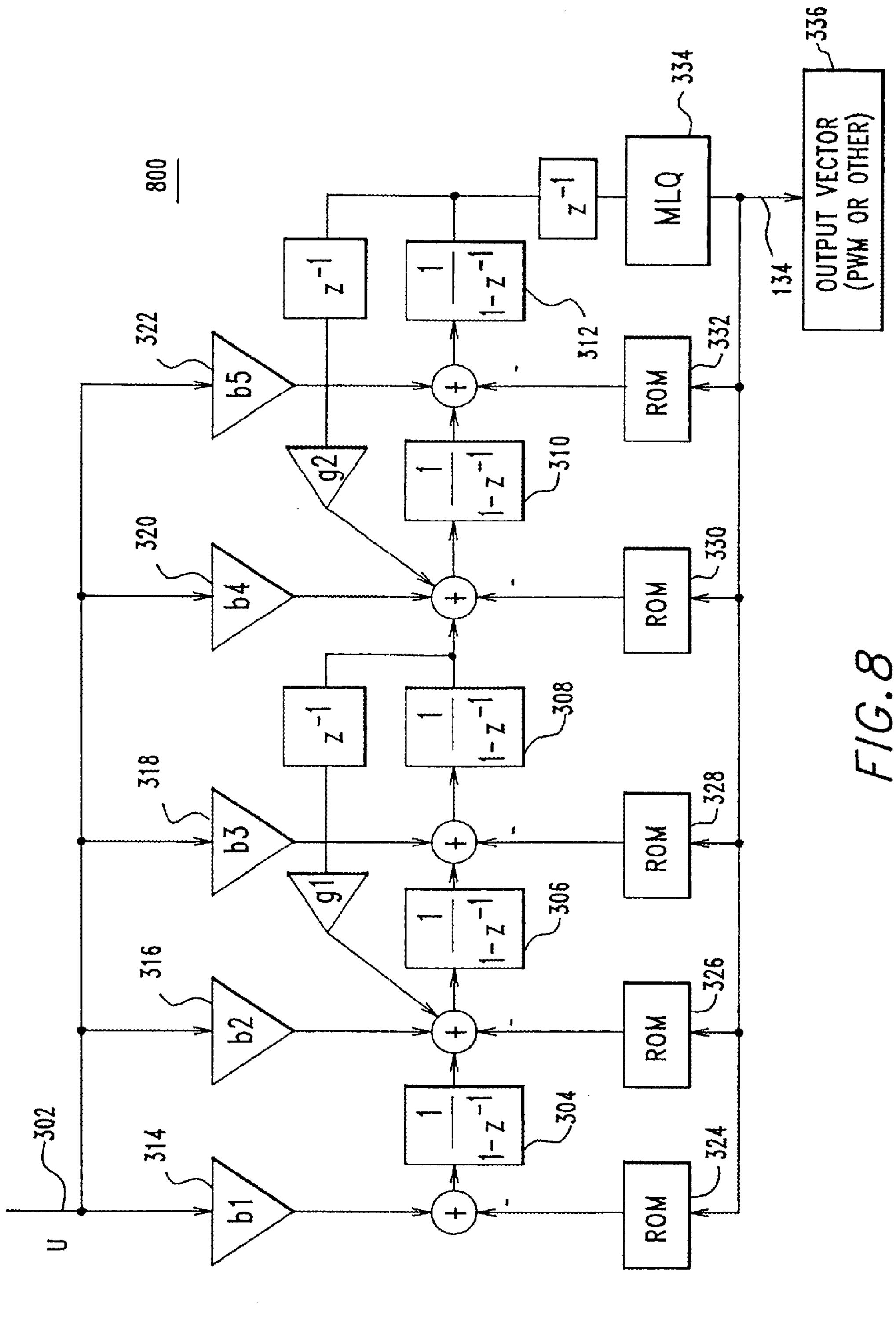
FIG. 8 shows a ROM-based implementation of a system employing a standard feed forward mechanism and MMNF feedback.

FIG. 8 shows a ROM based implementation of a modulator 800 employing a standard feed forward mechanism and MMNF feedback, implemented through ROMs. This is a convenient way to implement the system of FIG. 5, since the ROM handles both the nonlinear functions and the linear feedback gain. If resonator feedback values g1 and g2 are chosen to be powers of 2, or are sums of a small number of powers of 2, this system can be implemented with table lookups and a few additions.

The key element in the design of any of these systems is the design of the nonlinear feedback terms. In the works of Craven and Risbo, PWM or similar modulation is viewed as an inherently nonlinear process. In both cases, a model is built of the effects of the nonlinearity in the desired output band of the converter. A prediction is made for future effects, and added to the input of the converter. The modeling and prediction are approximations.

However, the effect of PWM is, in fact, linear; it only appears nonlinear because of the choice of sample rate. If viewed at the rate of the medium clock, PWM seems to have an inherently nonlinear nature. This is due only to the chosen frame of reference. If the process is viewed at the high clock rate, or more generally as a continuous time system, the nonlinear effects disappear. This is the basis for the design approach described here: the resulting designs are very general, easily implemented, and perform optimally.

The medium clock rate is defined to be the rate of operation of the noise shaping loop, and is nominally the pattern rate of the PWM output. The high clock rate is that at which the PWM output patterns may be defined, typically an integer multiple of the medium clock rate. The ratio of the clock rates is called the stepup ratio.

The design process, then, has 4 steps:

1. The normal design of a delta sigma noise shaping filter, at the medium clock rate.
2. The transformation of the noise shaping filter to an equivalent one, operating at the higher clock rate.
3. Determining the response of the system to PWM modulation at the high clock rate.
4. Determining the net effect of the response when viewed at the medium clock rate.

The corrections employed as a result of step 4 will be nonlinear, not due to any inherent nonlinear aspect to the modulation, but due to the chosen frame of reference. The noise shaping loop could, at much greater computational expense, be run at the high clock, and there would be no nonlinear behavior in the system. We see, then, that the nonlinear functions are strictly computational shortcuts, which make implementation easier. There is no approximation involved in this approach, unlike those of Craven and Risbo. In addition, the resulting implementations are very simple.

FIG. 9 is a Mathematical implementation of the calculation of MMNF correction terms for a PWM stage. An example will be used to illustrate the operation of the code in FIG. 9, and the design of a delta sigma converter using MMNF feedback correction terms.

We assume a step up ratio of 8 in a PWM stage, using these patterns:

1. 00000000
2. 00001000
3. 00011000
4. 00011100
5. 00111100
6. 00111110
7. 01111110
8. 01111111
9. 11111111

The eight time slots are centered, relative to their overall center, at −7/16, −5/16, −3/16, −1/16, 1/16,3/16, 5/16, 7/16.

We assume that the delta sigma modulator is a feed forward type, implemented by the following code:

output=Quantize{i0, i1, i2, i3);
i0=i0+input-output;
i1=i1+i0;
i2 =i2+i1;
i3=i3+i2.

A state variable nomenclature will be used in this discussion: see the reference "Digital Signal Processing", by Roberts and Mullis (Addison-Wesley Publishers, 1987). 'Quantize' is a function which implements the poles of the transfer function, dithers, and quantizes to levels 0 through 8.

The state transition matrix, A, is:

1000
1100
1110
1111

This matrix can be interpreted in the following way. With each time step, i0 will be added with unity gain to i0,i1,i2,i3; i1 will be added with unity gain to i1, i2,i3; i2will be added with unity gain to i2, i3; and i3 will be added with unity gain only to i3. For delta sigma modulators of the feed forward kind, with zero delay integrators and no local resonators, the transition matrices will always be triangular with ones down the diagonal (unimodular matrices).

The vector defining the response to the output feedback B is {−1 ,−1 ,−1 ,−1}, which can be interpreted as follows: at each time step, subtract the old output from each of i0,i1, i2,i3.

A and B completely describe the response of the system to an arbitrary feedback pulse type.

For an event in the −7/16 time slot, the proper feedback is the vector given by A^(7/16)*B, or AA^(7)*B, where AA is generally the 2nth root of A, where n is the step up ratio of the system (in this example, n=8, so AA is the $16^{th}$ root of A). In this case, AA is:

| | | | |
|---|---|---|---|
| 1 | 0 | 0 | 0 |
| 1/16 | 1 | 0 | 0 |
| 17/512 | 1/16 | 1 | 0 |
| 187/8192 | 17/512 | 1/16 | 1 |

It must be noted that there is often no closed form solution of the problem of finding the 2nth root of the state transition matrix, since unimodular matrices do not generally have complete bases of eigenvalues (i.e., are not diagonalizable). A Newton-Raphson technique has been found to give good solutions.

The proper feedback for the 2 state is therefore:

$$FB(2){:=}(AA\hat{\ }1)*B+(AA\hat{\ }{-1})*B.$$

For this example, $$FB(2)=\{-2, -2, -513/256, -257/128).$$

This process is repeated for each pulse width.

The following 8 by 4 matrix gives the summed correction factors for each state in the present example:

| | | |
|---|---|---|
| −1 | −0.9375 | −0.908203–.889282 |
| −2 | −2 | −2.00391–2.00781 |
| −3 | −2.8125 | −2.74023–2.69812 |
| −4 | −4 | −4.03906–4.07813 |
| −5 | −4.6875 | −4.61914–4.59778 |
| −6 | −6 | −6.13672–6.27344 |
| −7 | −6.5625 | −6.57617–6.6488 |
| −8 | −8 | −8.32813–8.65625 |

In the Mathematical code in FIG. 4, the feedback functions are fit to polynomials. Experimentation has shown that a cubic fit is usually adequate. The polynomial functions are often a convenient representation.

To summarize, first the state transition matrix and the desired feedback vector for a system must be determined. The 2nth root, AA, of the state transition matrix is calculated, using either a closed form or iterative method. A table consisting of the needed powers of AA is calculated, and the matrices in the table are summed in accordance with each of the desired PWM patterns. The resulting matrices, one for each PWM pattern, are then multiplied by the desired feedback vector; this gives the feedback functions to be applied at each integrator. If desired, polynomials can then be fitted to the feedback functions, and the procedure of summing powers of the roots of the state transition matrix can be repeated.

In FIG. 9, the function 'makedsfb' simulates a standard feedback type of delta sigma modulator. The location of the local resonator zeros is chosen to make implementation easier. An $8^{th}$ order design with Butterworth poles is chosen, and the stepup is 128. This will require the $256^{th}$ root of the state transition matrix to be calculated. The state transition matrix of the integrator string is determined by well known techniques described in "Digital Signal Processing", by Roberts and Mullis.

The function 'mkrt' in the module 'makecora' finds the $256^{th}$ root of the state transition matrix, using Newton-Raphson iteration. A table of fractional powers of the state transition matrix is then formed, md, by taking powers of the root matrix. Two vectors, denoted 'lft' and 'rght', are created which define the shapes of the PWM pulses for all 129 possible pulse widths. Summing the matrices in the table md through the ranges set by lft and rght produces the convolution matrix to apply to the desired feedback function. The 64-width pulse is used as a reference, and is made equivalent to a 64-area impulse.

The MMNFs are then extracted from these matrices. The nonlinear corrections necessary can be separated into two types, which we will call spreading and jitter. The spreading type of error is due to the change in the frequency response of the pulse as its width grows; a wider pulse rolls off more at high frequencies than a narrower one. The jitter terms are due to changes in the position of the pulse center for odd and even terms. For example, it is impossible to center pulses of width 2,4, or 6 at the same position as pulses of width 1, 3, or 5. This jitter effect accounts for the majority of the noise and distortion in the output analog signal, and is most important to correct.

The Mathematical 'fit' function is then used to fit polynomials to the correction terms. Optionally, all of the corrections can be used as is, for example, by placing them in a ROM.

Figure 11A:
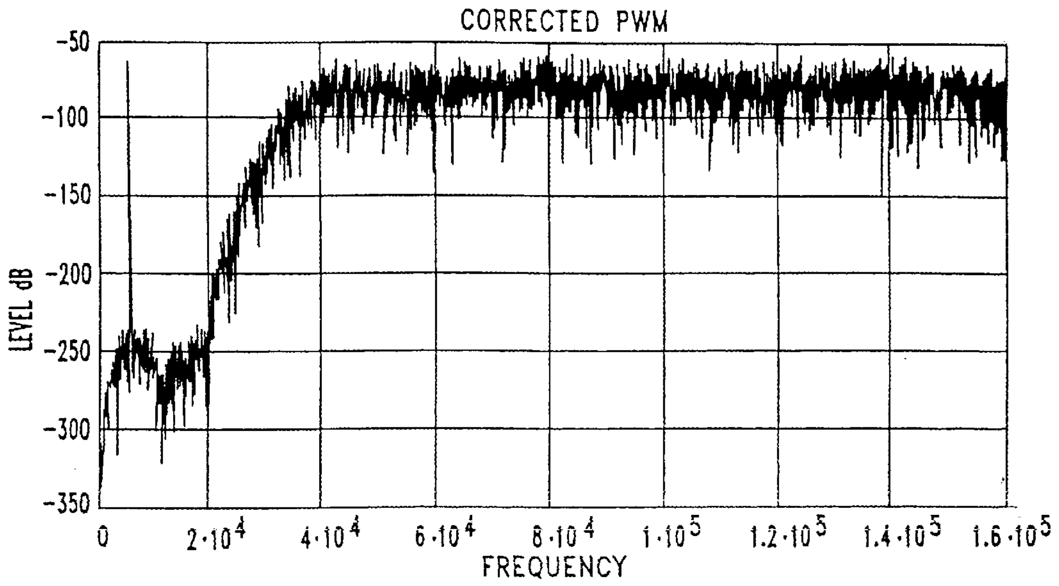
FIG. 11 shows the spectrum of the output for both the PWM system and the original modeled multi quantizer system.
Figure 11B:
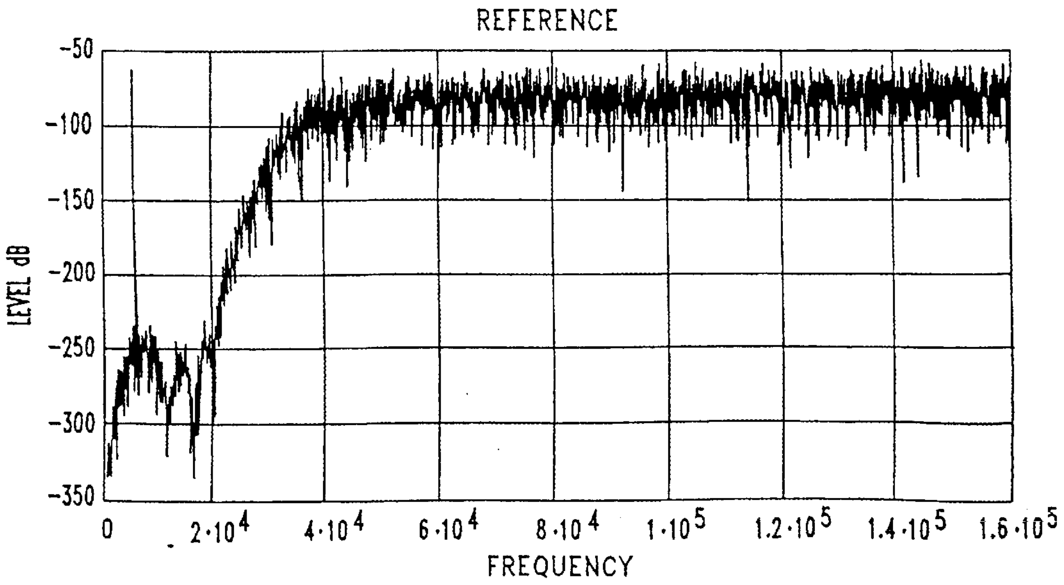

FIG. 10 is C++ code to simulate an $8^{th}$ order PWM stage, implemented using MMNFs for correction. In pass 0 of the simulation, no correction is enabled. In pass 1, the jitter correction is enabled (i.e., only the linear 'jitter' term is kept in the polynomial fits to the correction functions). In pass 2, the jitter and square terms are kept for each correction function. In pass 3, the reference modulator only is simulated—no pulse wave modulation is used. For each pass, and for various tone levels, the frequency response of the simulator to a high bandwidth signal is calculated. FIG. 11 shows the spectrum of the output for both the PWM system and the original modeled multi quantizer system. The input is a sine wave at −60 dB. It can be seen that the responses of the two systems are essentially identical.

Figure 12:
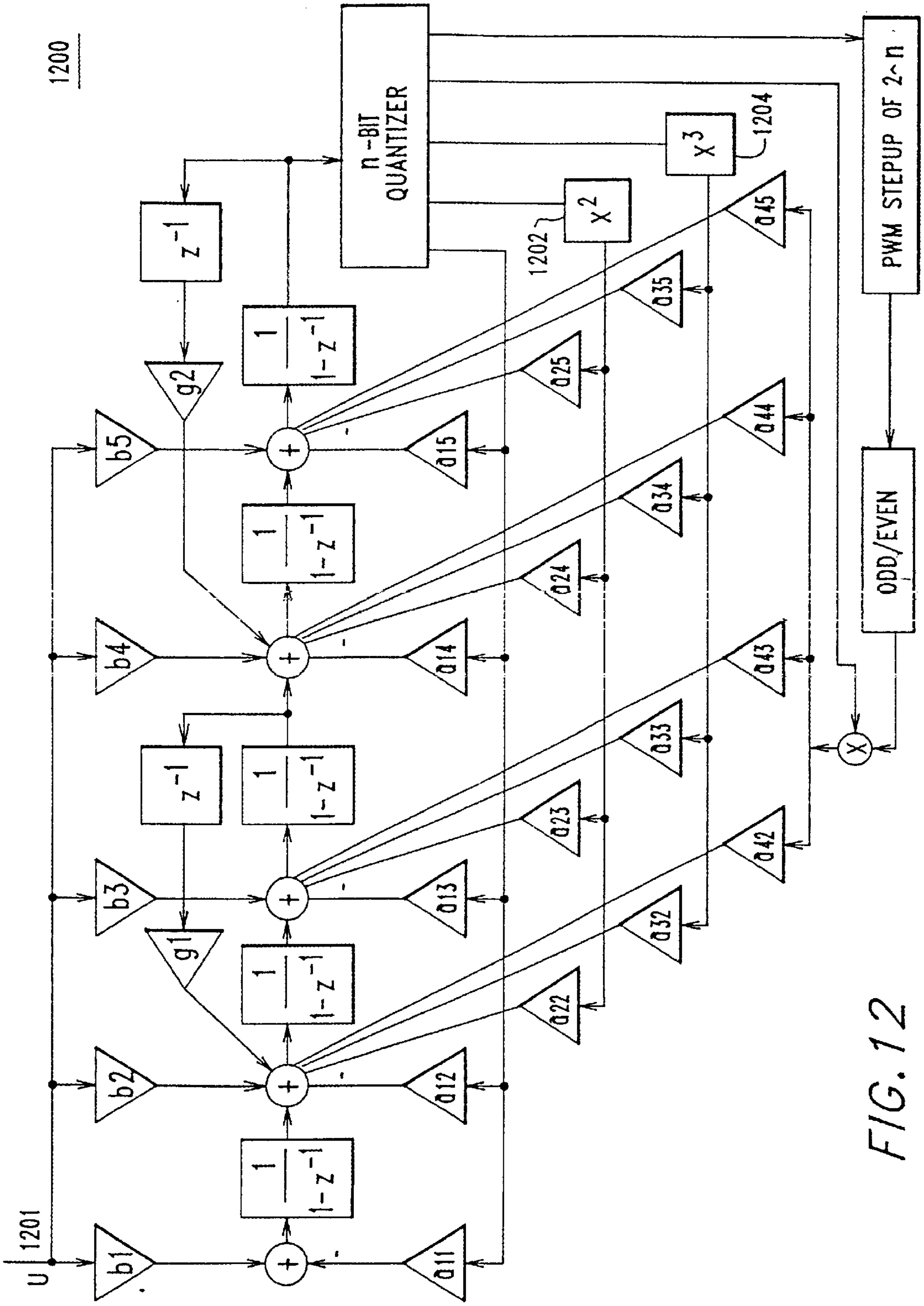
FIG. 12 is an implementation of a fifth-order modulator with real-time calculation of polynomial coefficients.
Figure 13:
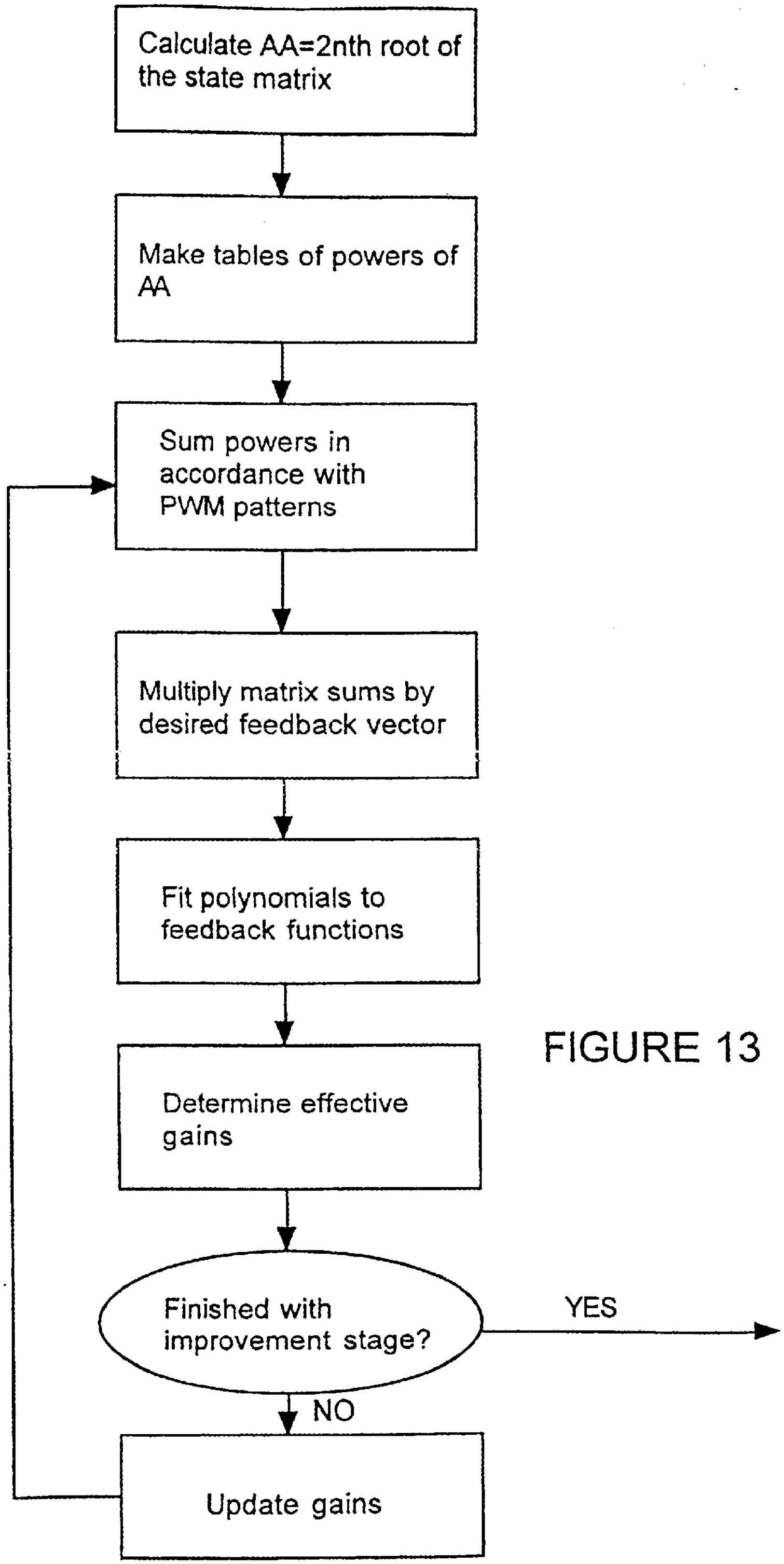
FIG. 13 is a flow chart of a correction process described in the text, using iteratively updated polynomial coefficients.

FIG. 12 shows one implementation 1200 of a $5^{th}$ order modulator with input 1201 where the calculation of the polynomial functions (via blocks 1202 and 1204 for calculating powers of the feedback from the quantizer, and scalars a11–a45 for implementing the polynomials) happening in real time. The use of the polynomial fit has a significant advantage. The MMNFs modify the average gain of the feedback loop, which causes the poles to move and the frequency response to be affected. The Mathematical program iteratively modifies the feedback functions, and recalculates the correction factors, so that the transfer function is the same as the original loop when a low level signal is applied. This improvement stage can significantly help for high gain or low oversample ratio stages. FIG. 13 is a flow chart of the correction process described above, using updated polynomial coefficients.

The ability to change stepup ratios on the fly with this technique is useful. If the stepup ratio is randomly chosen and varies among 127, 128, and 129, the spectrum of the output signal is spread. This is useful in the design of high powered output stages, where radio frequency emissions may produce problematic interference. In addition, dithering is a significant issue in the design of delta sigma converters: see chapter 3 in the reference "Delta-sigma Data Converters" for a discussion. Switching between stepup ratios helps to dither the quantizer, and the amount of added dither required is cut in half, which improves the SNR. To design such a system, the feedback functions are found using the techniques described above for the center stepup ratio (in this case, 128). The same AA matrix is then used for the other ratios (127 and 129 in this case), producing the feedback term for those ratios. In a related technique, the quantizer can choose the stepup ratio on the fly. For a low level signal, near the middle, the quantization levels are cut in half. This gives a 6 dB improvement in SNR, and cuts radio frequency emissions.

The same techniques can be applied to correction of the input elements for the case where they are not simple sampled signals. It could be necessary to convert from a 1-bit stream at 128 Fs to a multiple-bit stream at 16 Fs. Eight input bits would be handled at a time (128/16). The correction would be calculated for each of the 256 8-bit streams, and stored in a table. Alternately, correction terms could be found for each input position, and summed. It has been found to be advantageous to pre-process the bit stream through an FIR lowpass filter, and to then apply the correction terms. This could all be performed by table lookup. In this case, the definition of the MMNF is slightly different. The input is a vector (more than one data point). The elements are summed, scaled, and applied to the first input stage. The value applied to the other stages is not a simple scaling of this term, but is instead a different linear combination of the data in the input vector. This can be accomplished as a set of vector dot products, input*correct[i], where input is a vector of input samples, and correct[i] is a correction vector which is optimized for each stage. These vectors are not simple linear gains times the unity vector, and therefore they appear nonlinearly determined, but are not.

Related techniques can be used in sample rate conversion applications, where the sample rates are not related by an integer multiple. For sample rate conversion applications, the input stream, at rate fsl, is first oversampled, to (say) rate 256*fs1. These techniques are described in chapter 13 of "Delta Sigma Data Converters". The delta sigma modulator is to be run at fs2, where fs2 is not a simple integral multiple of fs1. The 256*fs1 stream is re-sampled at, say, 16*fs2. If the oversample rates are sufficient, no significant distortion is involved. The final signal is applied to a modulator with the MMNF correction enabled. In effect, the nonlinear functions correct for the time jitter of the input signal, and effect the sample rate conversion, which can be viewed as a time varying shift in the time offset.

Again, in the C++ program of FIG. 14, some simplifications are shown to be appropriate to achieve the desired performance specification. Our interest lies in the case where at least one of the feed forward or feedback terms is not a simple linear function of one of the others.

The analysis here assumes that the low rate system is designed, converted to an equivalent high rate system, the inputs are applied, and the system is then converted back to the low rate. The final system will then contain MMNFs. Obviously, the feedback and feed forward techniques can be combined. This is the preferred embodiment. Other embodiments could include running the system at the high rate, or designing the original system at the high rate and then converting back to the low rate. These implementations are significantly less desirable.

As the stepup ratio increases, the system may be thought of as a continuous time system. This can be useful in the analysis and correction of digital to analog converters with imperfect outputs, such as non-matching rise and fall times.

What is claimed is:

1. A delta sigma modulator of at least second order, operating at an operating clock rate, having an input and producing an output in response to the input, comprising:

at least two state variables:

a quantizer having an input responsive to one of the state variables and providing a feedback signal and a modulator output signal;

two mutually nonlinear function blocks, each applying a nonlinear function to the feedback from the quantizer, to form two mutually nonlinear feedback signals; and two adders, each adder for adding one of the nonlinear feedback signals to the input of one of the state variables;

wherein the nonlinear functions applied by the function blocks are substantially linear functions when viewed at a clock rate which is a multiple of the operating clock rate.

2. The modulator of claim 1, wherein the nonlinear function blocks comprise read only memories.

3. The modulator of claim 1, wherein the nonlinear function blocks comprise blocks for generating powers of the feedback from the quantizer and scalar multipliers for implementing polynomials.

4. A method for correcting distortion in a delta sigma modulator of at least second order, having at least two state variables responsive to feedback from an output quantizer and operating at an operating clock rate, comprising the steps of:

determining a system equivalent to the modulator, the system operating at a higher clock rate, the higher clock rate being a multiple of the operating clock rate, wherein the output of the system is substantially linear at the higher clock rate;

modeling the response to system operation at the higher clock rate;

modelling the correction to be applied to each integrator feedback path at the higher clock rate to correct the modelled distortion;

computing the correction to be applied within the modulator at the operating clock rate such that the modulator operating at the operating clock rate substantially matches the operation of the system operating at the higher clock rate in response to the same outputs; and implementing the computed correction by applying at least two mutually nonlinear functions to the feedback from the quantizer, and adding the respective results to at least two state variables.

5. The method of claim 4, wherein the step of computing the correction includes the steps of determining the roots of the state transition matrix and computing the mutually nonlinear functions based on the roots.

6. The method of claim 4, wherein the step of applying mutually nonlinear functions includes the step of computing powers of the feedback from the quantizer and applying scaling to the powers.

7. The method of claim 4, wherein the step of applying mutually nonlinear functions includes the step of looking up values in look up tables based upon the feedback from the quantizer.

8. A method for correcting distortion in a delta sigma modulator of at least second order, having at least two state variables responsive to feedback from an output quantizer and operating at an operating clock rate, comprising the steps of:

calculating the roots of the state transition matrix;

forming tables of the powers of the matrix;

summing the powers in accordance with selected output patterns of the modulator;

multiplying the matrix sums by a desired feedback vector to generate feedback functions; and applying the feedback functions to the state variables.

* * * * *